(12) United States Patent
Kato

(10) Patent No.: US 7,251,766 B2
(45) Date of Patent: Jul. 31, 2007

(54) TEST METHOD AND TEST CIRCUIT FOR ELECTRONIC DEVICE

(75) Inventor: Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/198,221

(22) Filed: Aug. 8, 2005

(65) Prior Publication Data
US 2005/0270859 A1 Dec. 8, 2005

Related U.S. Application Data

(62) Division of application No. 09/494,953, filed on Feb. 1, 2000.

(30) Foreign Application Priority Data

Feb. 2, 1999 (JP) ................... 11-024890
Feb. 16, 1999 (JP) ................... 11-037910

(51) Int. Cl.
*G01R 31/28* (2006.01)
*H03K 19/00* (2006.01)
(52) U.S. Cl. .................. 714/733; 714/727; 326/16
(58) Field of Classification Search ............... 714/727, 714/733; 326/16
See application file for complete search history.

(56) References Cited

U.S. PATENT DOCUMENTS

| 4,049,956 A | | 9/1977 | Van Veen | |
|---|---|---|---|---|
| 4,255,789 A | * | 3/1981 | Hartford et al. ............ | 701/108 |
| 4,672,583 A | * | 6/1987 | Nakaizumi .................. | 365/222 |
| 4,691,161 A | * | 9/1987 | Kant et al. .................. | 714/726 |
| 4,698,588 A | * | 10/1987 | Hwang et al. ............. | 324/73.1 |
| 4,733,405 A | * | 3/1988 | Shimizume et al. .......... | 377/29 |
| 4,847,838 A | | 7/1989 | Kralik | |
| 4,897,817 A | * | 1/1990 | Katanosaka ................. | 365/201 |

(Continued)

FOREIGN PATENT DOCUMENTS

EP 0 744 755 A1 11/1996

(Continued)

OTHER PUBLICATIONS

Borghesani, A. F., et al. "A Simple IEEE-488 Bus Tester", Review of Scientific Instruments, American Institute of Physics, New York, US, vol. 66, No. 6, Jun. 1, 1995, pp. 3711-3712, XP000511254 ISSN: 0034-6748.

(Continued)

*Primary Examiner*—Joseph D. Torres
(74) *Attorney, Agent, or Firm*—Arent Fox, LLP

(57) ABSTRACT

A method of testing an electronic device including first and second semiconductor devices connected to each other with a plurality of bus lines. First, the first semiconductor device supplies a selected one of the bus lines with a first logical output signal. Then, the second semiconductor device acquires a first bus line signal from the selected bus line. The second semiconductor device inverts the first bus line signal to generate a second logical output signal. The second semiconductor device transmits the second logical output signal to the first semiconductor device. The first semiconductor device receives a second bus line signal from the selected bus line. The first semiconductor device compares the first logical output signal and the second bus line signal to detect a connection between the first semiconductor device and the second semiconductor device.

19 Claims, 14 Drawing Sheets

U.S. PATENT DOCUMENTS

| | | | |
|---|---|---|---|
| 5,193,093 A | | 3/1993 | Okazaki |
| 5,299,203 A | * | 3/1994 | Steele .................... 714/724 |
| 5,331,571 A | * | 7/1994 | Aronoff et al. ............ 716/4 |
| 5,367,395 A | | 11/1994 | Yajima et al. |
| 5,367,491 A | * | 11/1994 | Han et al. ................ 365/201 |
| 5,369,645 A | | 11/1994 | Pritchard et al. |
| 5,495,486 A | * | 2/1996 | Gheewala .............. 714/724 |
| 5,644,251 A | * | 7/1997 | Colwell et al. ........... 326/16 |
| 5,659,548 A | | 8/1997 | Okamoto et al. |
| 5,770,964 A | | 6/1998 | Suma |

FOREIGN PATENT DOCUMENTS

| | | |
|---|---|---|
| JP | 01-262486 A | 10/1989 |
| JP | 03-210483 A | 9/1991 |
| JP | 05053857 A | 3/1993 |
| JP | 5-99980 | 4/1993 |
| JP | 05-099980 A | 4/1993 |
| JP | 5-043400 A | 6/1993 |
| JP | 05-275621 A | 10/1993 |
| JP | 07-027826 A | 1/1995 |
| JP | 7-159493 A | 6/1995 |
| JP | 7-174820 | 7/1995 |
| JP | 7-229951 A | 8/1995 |
| JP | 09-198274 A | 7/1997 |
| JP | 10-019992 A | 1/1998 |
| JP | 10-090360 A | 4/1998 |

OTHER PUBLICATIONS

International Publication No. WO 97/40394, Published Oct. 30, 1997.

* cited by examiner

TEST METHOD AND TEST CIRCUIT FOR ELECTRONIC DEVICE

This is a Division of Application No. 09/494,953 filed Feb. 1, 2000. The disclosure of the prior application(s) is hereby incorporated by reference herein in its entirety.

BACKGROUND OF THE INVENTION

The present invention relates to a test circuit for electronic device, and more particularly, to a test circuit for detecting a short circuit failure or open circuit failure of bus lines connecting plural semiconductor devices (IC, LSI) incorporated in the electronic device.

The open/short circuit test for checking defects, such as short circuits across bus lines, short circuits across input/output pins, open circuits of bus lines, disconnections between bus lines and input/output pins, etc., is usually conducted before shipment of electronic device. The test circuit for executing the open/short circuit test is often incorporated into a semiconductor device. One reason is, for example, in a Chip Size Package (CSP) such as a Ball Grid Array (BGA), the input/output pins do not appear outside the board after mounting the CSP on the board. It is then impossible to carry out the open/short circuit test required using a probe by bringing the probe into contact with the input/output pins.

The test circuit supplies a semiconductor device with specific test data through the bus lines that connect the semiconductor device and the test circuit. The test circuit determines if the data output from the semiconductor device is equal to the expected data, thereby detecting short circuits across the bus lines and open circuits of the bus lines.

Japanese Published Unexamined Patent Application No. 5-99980 discloses a method of testing electric device. As shown in FIG. 1, multiple semiconductor devices including a measured semiconductor device 1 containing a test circuit 1a, and a measuring semiconductor device 2 containing a receiving circuit 2a that receives signals from the test circuit 1a are mounted on a board. Input/output pins Pa1–Pan of the measured device 1 are connected to input/output pins Pb1–Pbn of the measuring device 2 through bus lines DB1–DBn. The test circuit 1a selects a specific input/output pin, for example, Pa1, outputs the data "1: H level" from the selected input/output pin Pa1, and outputs the data "0: L level" from the other, not selected, input/output pins Pa2–Pan.

If the expected value "1" is not detected at the input/output pin Pb1 of the measuring device 2, the test circuit 1a determines that the bus lines DB1–DBn connecting the input/output pins Pa1–Pan to Pb1–Pbn are open, or that the bus lines DB1–DBn are not connected with the input/output pins Pa1–Pan and Pb1–Pbn (detection open circuit failure). On the basis of the data from the remaining input/output pins, except for the specific input/output pin Pb1, if the logical value "1" is detected, it is determined that there is a short circuit across the detected input/output pins (Pa2–Pan, Pb2–Pbn) and the specific input/output pins Pa1, Pb1, or across the bus lines DB1–DBn. By selecting the input/output pins sequentially in accordance with their physical address, the test circuit 1a carries out the open circuit and short circuit tests for all of the input/output pins Pa1–Pan of the measured device 1.

In some electronic device, the bus lines DB1–DBn are in the floating state. In this case, even if the selected input/output pin has an open circuit failure, when the bus lines DB1–DBn have electric charges accumulated, the logical value of the input/output pins Pb1–Pbn of the measuring device 2 can possibly be set to the expected value "1". In such a case, even though the selected input/output pin has the open circuit failure, it is determined to be normal. That is, the open is not detected.

When the input/output pins Pa1–Pan are sequentially selected in accordance with the physical address, the logical value of the input/output pins Pa1–Pan is sequentially set to "1" in accordance with the physical address. In this case, there is a possibility of charges remaining on the bus line of the previously selected input/output pin. When a specific input/output pin of the measuring device 2 is the input/output pin Pb1 or Pb2 precedent to Pb3, for example, the remaining charges can sometimes make the test circuit detect the logical value "1", which is identical to the expected value of the input/output pin Pb3. In such a case, regardless of the input/output pins Pb1, Pb2 being correctly connected, they are determined as having a short circuit failure.

When the drive capability of the output driver (buffer) of the measured device 1 is high, even if the charges on the selected bus line DB3, for example, leak slightly, if the drive capability of the output driver is sufficiently high to overcome the leakage of the charges, the test circuit will detect the logical value "1", which is the same as the expected value, at the input/output pin Pb3. That is, the input/output pins Pa3, Pb3, and the bus line DB3 are determined as normal.

However, if the drive capability of the output driver of the measuring device 2 is low, even if the measuring device 2 outputs the logical value "1", if the drive capability of the output driver of the measuring device 2 is insufficient to cancel the leakage of the charges, the input/output pin Pa3 of the measured device 1 is supplied with the logical value "0". Therefore, although the connection between the device 1 and device 2 is faulty, it is determined as normal; or in reverse, it is determined as a failure, although it is normal.

In order to prevent such errors, it is conceivable to bidirectionally transmit and receive data between the measured device 1 and the measuring device 2 when carry out the test using the test circuit 1a and the receiving circuit 2a. However, using the test circuit 1a and the receiving circuit 2a leads to increasing the circuit size of the device 1 and device 2.

FIG. 2 is a schematic diagram of a prior art semiconductor device 100 provided with a test circuit. The semiconductor device 100 has multiple input pads IN0–INn, multiple output pads DQ0–DQn, and a test input pad IN. The input pads IN0–INn are each connected to input buffers 281, and to an internal circuit 282 through internal bus lines BLin. The output pads DQ0–DQn are each connected to output buffers 283, and to the internal circuit 282 through internal bus lines BLout.

The input pads IN0–INn are connected to respective test circuits 285. The test circuits 285 receive test signals from an external device through the input pads IN0–INn. The test circuits 285 are also each connected to the single test input pad IN, and receive a test signal from the external device through the test input pad IN. The output pads DQ0–DQn are each connected to test-dedicated output circuits 286, and the test-dedicated output circuits 286 are each connected to the test circuits 285 through test-dedicated internal bus lines BLex.

The test circuits 285 receive the test signals from the external device through the input pads IN0–INn and test input pad IN, and supply detection signals to the test-dedicated output circuits 286 through the test-dedicated internal bus lines BLex. The test-dedicated output circuits 286 supply, in response to the detection signals, response signals to the external device through the output pads DQ0–DQn.

When the terminals of the CSP connected to the input pads IN0–INn and the test input pad IN are properly connected to the wiring of the board, the test circuits 285 receive the test signals, and deliver the detection signals. On the other hand, when the terminals are not properly connected (non-conductive), the test circuits 285 do not deliver the detection signals and the test-dedicated output circuits 286 do not output the response signals.

When the terminals of the CSP connected to the output pads DQ0–DQn are properly connected to the wiring of the board, the response signals from the test-dedicated output circuits 286 are supplied to the external device. On the other hand, when the terminals are not properly connected (non-conductive), the response signals from the test-dedicated output circuits 286 are not supplied to the external device. Thus, based on the presence of the response signals, the connection (continuity state) between the terminals of the CSP and the wiring of the board is determined.

However, the provision of the test circuits 285, test-dedicated output circuits 286, and test-dedicated internal bus lines BLex increases the circuit size of the semiconductor device.

Further, while a continuity test is carried out on one semiconductor device, if there is a continuity failure in another semiconductor device, on the basis of the continuity failure, the other semiconductor devices will be selected for testing. In this case, plural semiconductor devices operate simultaneously on the board, and bus contention is created on the board. Accordingly, it is necessary to regulate the operation of the semiconductor devices other than the device being tested.

SUMMARY OF THE INVENTION

The present invention has been made in view of the foregoing circumstances, and it is an object of the invention to provide a method of testing electronic device that securely executes the open circuit/short circuit tests, while preventing an increase of circuit areas for test.

In order to accomplish the foregoing object, a method of testing an electronic device including first and second semiconductor devices connected to each other with a plurality of bus lines is provided. First, the first semiconductor device supplies a selected one of the bus lines with a first logical output signal. Then, the second semiconductor device acquires a first bus line signal from the selected bus line. The second semiconductor device inverts the first bus line signal to generate a second logical output signal. The second semiconductor device transmits the second logical output signal to the first semiconductor device. The first semiconductor device receives a second bus line signal from the selected bus line. The first semiconductor device compares the first logical output signal and the second bus line signal to judge a connection between the first semiconductor device and the second semiconductor device.

In another aspect of the invention, a method of testing an electronic device including first and second semiconductor devices connected to each other with a plurality of bus lines is provides. First, the first semiconductor device supplies a selected one of the bus lines with a first logical output signal. Then, the second semiconductor device acquires a first bus line signal from the selected bus line. After outputting the first logical output signal, the first semiconductor device generates a second logical output signal being an inverted signal of the first logical output signal and supplies the selected bus line with the second logical output signal. The second semiconductor device outputs the acquired first bus line signal. The first semiconductor device receives a second bus line signal from the selected bus line. The first semiconductor device compares the first logical output signal and the received second bus line signal to judge a connection between the first semiconductor device and the second semiconductor device.

In another aspect of the invention, an electronic device comprising first and second semiconductor devices connected to each other with a plurality of bus lines is provided. The first semiconductor device includes a first output circuit connected to each bus line for supplying each bus line with a first logical output signal, and a comparison circuit connected to each bus line. The second semiconductor device includes an input circuit connected to each bus line for acquiring a first bus line signal A second output circuit inverts the first bus line signal to generate a second logical output signal, and supplies a corresponding bus line with the second logical output signal. The comparison circuit receives a second bus line signal and compares the first logical output signal and the second bus line signal to generate a judgement signal regarding a connection between the first semiconductor device and the second semiconductor device.

In another aspect of the invention, an electronic device comprising first and second semiconductor devices connected to each other with a plurality of bus lines is provided. The first semiconductor device includes a first output circuit connected to each bus line for supplying each bus line with a first logical output signal. An inversion output circuit supplies each bus line with a second logical output signal being an inverted signal of the first logical output signal after the first output circuit supplies the first logical output signal. A comparison circuit is connected to each bus line. The second semiconductor device includes an input circuit connected to each bus line for acquiring a first bus line signal A second output circuit supplies a corresponding bus line with the first bus line signal. The comparison circuit receives a second bus line signal and compares the first logical output signal and the second bus line signal to generate a judgement signal regarding a connection between the first semiconductor device and the second semiconductor device.

In another aspect of the present invention, a semiconductor device is provided that includes input terminals, output terminals, an internal circuit, first bus lines connecting the input terminals and the internal circuit, respectively, second bus lines connecting the output terminals and the internal circuit, respectively, and test circuits connected between the input terminals and the output terminals via test signal transmission paths. At least a part of the first bus lines or the second bus lines is shared by the test signal transmission paths.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
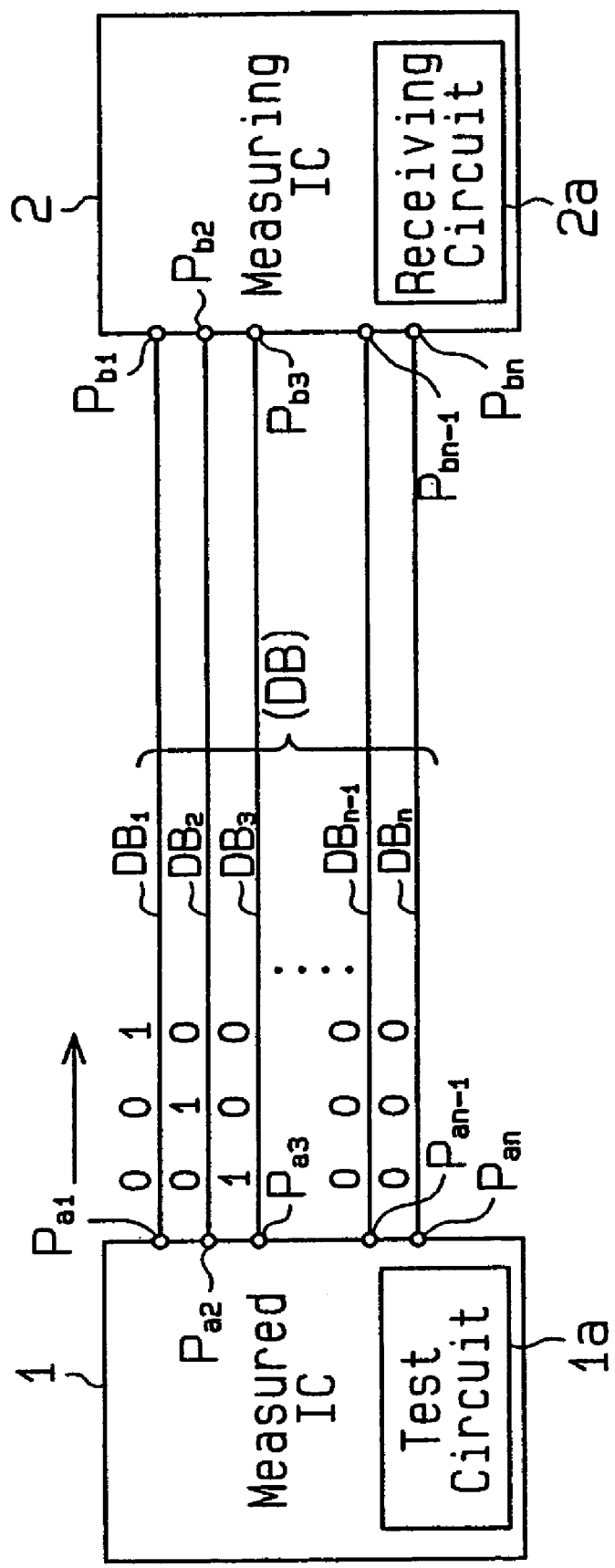
FIG. 1 is a schematic block diagram of a conventional electronic device.

In the drawings, like numerals are used for like elements throughout.

[First Embodiment]

Figure 3:
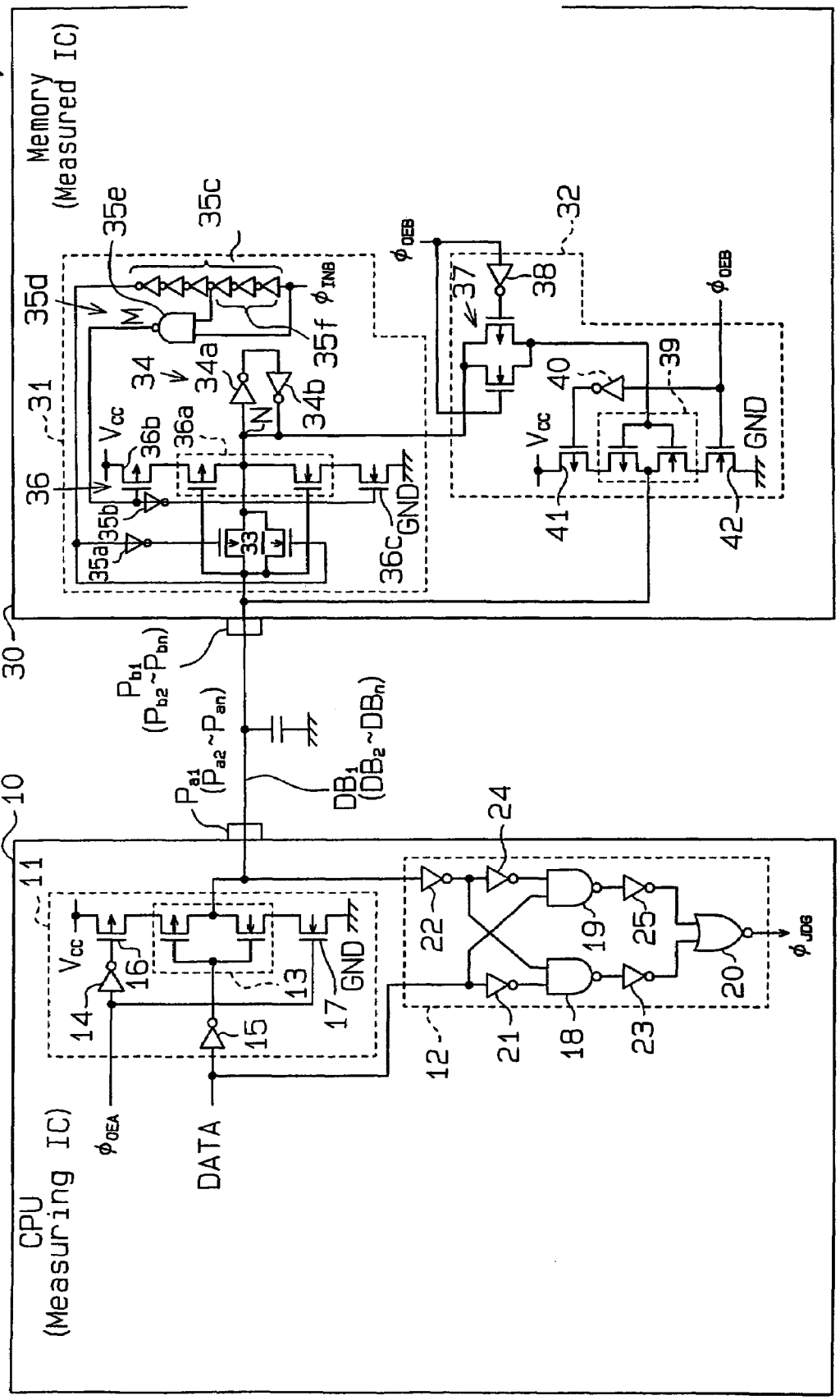
FIG. 3 is a schematic circuit diagram of an electronic device according to a first embodiment of the present invention.

FIG. 3 is a schematic circuit diagram of an electronic device 200 in accordance with a first embodiment of the present invention. The electronic device 200 includes multiple semiconductor devices (IC) including a CPU 10 mounted on a board (not illustrated) and a memory unit 30. The CPU 10 is a measuring IC, and the memory 30 is a measured IC. Input/output pins Pa1–Pan (Pa1 representatively illustrated) of the CPU 10 are each connected to input/output pins Pb1–Pbn (Pb1 representatively illustrated) of the memory 30 through bus lines DB1–DBn (DB1 representatively illustrated). The bus lines DB1–DBn are designed such that they are electrically floating.

The CPU 10 includes plural data output units 11 each connected to the input/output pins Pa1–Pan and plural data comparison units 12. FIG. 3 illustrates one data output unit 11 connected to the input/output pin Pa1 and one data comparison unit 12. The remaining data output units and remaining data comparison units have the same configuration as the data output unit 11 and data comparison unit 12.

The data output unit 11 includes three inverters 13–15, a PMOS transistor 16, and an NMOS transistor 17. The inverter 13 is preferably a CMOS inverter. The first terminal of the inverter 13 is connected to a high potential power supply Vcc through the PMOS transistor 16, and the second terminal thereof is connected to a low potential power supply (ground) GND through the NMOS transistor 17. The gate of the PMOS transistor 16 receives an inverted control signal φOEA from the inverter 14. The gate of the NMOS transistor 17 receives the control signal φOEA. The input terminal of the inverter 13 receives a signal DATA inverted by the inverter 15 from an internal circuit (not illustrated) of the CPU 10. The output terminal of the inverter 13 is connected to the input/output pin Pa1. The inverter 13 is activated when the control signal φOEA is at the H level and supplies the DATA to the input/output pin Pa1.

The data comparison unit 12 includes two NAND circuits 18, 19, a NOR circuit 20, and five inverters 21–25. The first input terminal of the NAND circuit 18 is supplied with DATA inverted by the inverter 21, and the second input terminal is supplied with a signal inverted by the inverter 22. The input terminal of the inverter 22 is connected to the input/output pin Pa1.

The first input terminal of the NAND circuit 19 is supplied with DATA, and the second input terminal is supplied with the output signal from the inverter 22 inverted signal by the inverter 24. The NOR circuit 20 receives the output of the NAND circuit 18 inverted by the inverter 23 and the output of the NAND circuit 19 inverted by the inverter 25, and generates a determination signal φJDG. The data comparison unit 12 outputs the determination signal φJDG low, when the logical values of DATA and the data of the input/output pin Pa1 are equal, and high when the logical values are not equal.

The memory 30 includes plural latches 31 and plural logical units 32, which are each connected to the input/output pins Pb1–Pbn. FIG. 3 illustrates one latch 31 connected to the input/output pin Pb1 and one logical unit 32. The remaining latches 31 and logical units 32 have the same configuration as the latch 31 and logical unit 32 shown in FIG. 3.

The latch 31 includes a transfer gate 33, a latch circuit 34, inverters 35a, 35b, a delay circuit 35c, a control circuit 35d, and a reset circuit 36. The transfer gate 33 is preferably a CMOS transfer gate, which is connected between the input/output pin Pb1 and the latch circuit 34. The gate of the PMOS transistor of the transfer gate 33 receives a delayed and inverted control signal φINB from the delay circuit 35c and the inverter 35a. The gate of the NMOS transistor of the transfer gate 33 receives the delayed control signal φINB from the delay circuit 35c. The delay circuit 35c is preferably configured with an even number of inverters.

The reset circuit 36 includes a CMOS inverter 36a, a PMOS transistor 36b, and an NMOS transistor 36c. The input terminal of the inverter 36a is connected to the input/output pin Pb1, and the output terminal is connected to the latch circuit 34. The first power supply terminal of the inverter 36a is connected to a high potential power supply Vcc through the PMOS transistor 36b, and the second power supply terminal is connected to the ground GND through the NMOS transistor 36c. The gate of the PMOS transistor 36b receives a control signal M from the control circuit 35d, and the gate of the NMOS transistor 36c receives the control signal M inverted by the inverter 35b.

The control circuit 35d includes a NAND circuit 35e and an odd stage (three stage) inverter 35f. The NAND circuit 35e receives the control signal φINB and the control signal φINB inverted by the odd stage inverter 35f, and outputs the control signal M. The control signal M is low for a specific period, as the control signal φINB rises. The time during which the control signal M is low is shorter than the delay time of the control signal φINB by the delay circuit 35c. The reset circuit 36 resets the latch circuit 34 as determined by the control signal M.

The latch circuit 34 includes two inverters 34a, 34b. The input terminal of the inverter 34a is connected to the transfer gate 33, and the output terminal thereof is connected to the input terminal of the inverter 34b. The output terminal of the inverter 34b is connected to the input terminal of the inverter 34a. A node N between the transfer gate 33 and the input terminal of the inverter 34a is the output node of the latch circuit 34, which is connected to the logical unit 32. If the transfer gate 33 is made conductive by the high control signal φINB, the latch circuit 34 will latch the DATA supplied to the input/output pin Pb1.

The logical unit 32 includes a transfer gate 37, three inverters 38–40, a PMOS transistor 41, an NMOS transistor 42. The transfer gate 37 is preferably a CMOS type transfer gate. The transfer gate 37 is connected between the node N of the latch 31 and the input terminal of the inverter 39. The gate of PMOS transistor of the transfer gate 37 is supplied with a control signal φOEB inverted by the inverter 38, the gate of NMOS transistor is supplied with the control signal φOEB.

The inverter 39 is preferably a CMOS type inverter. The first power supply terminal of the inverter 39 is connected to the high potential power supply Vcc through the PMOS transistor 41, and the second power supply terminal is connected to the ground GND through the NMOS transistor 42. The gate of the PMOS transistor 41 is supplied with the control signal φOEB inverted by the inverter 40, and the gate of the NMOS transistor 42 is supplied with the control signal φOEB. The output terminal of the inverter 39 is connected to the input/output pin Pb1. If the transfer gate 37 is made conductive by the high control signal φOEB and the inverter 39 is activated, the inverted DATA is supplied to the input/output pin Pb1.

Figure 4:
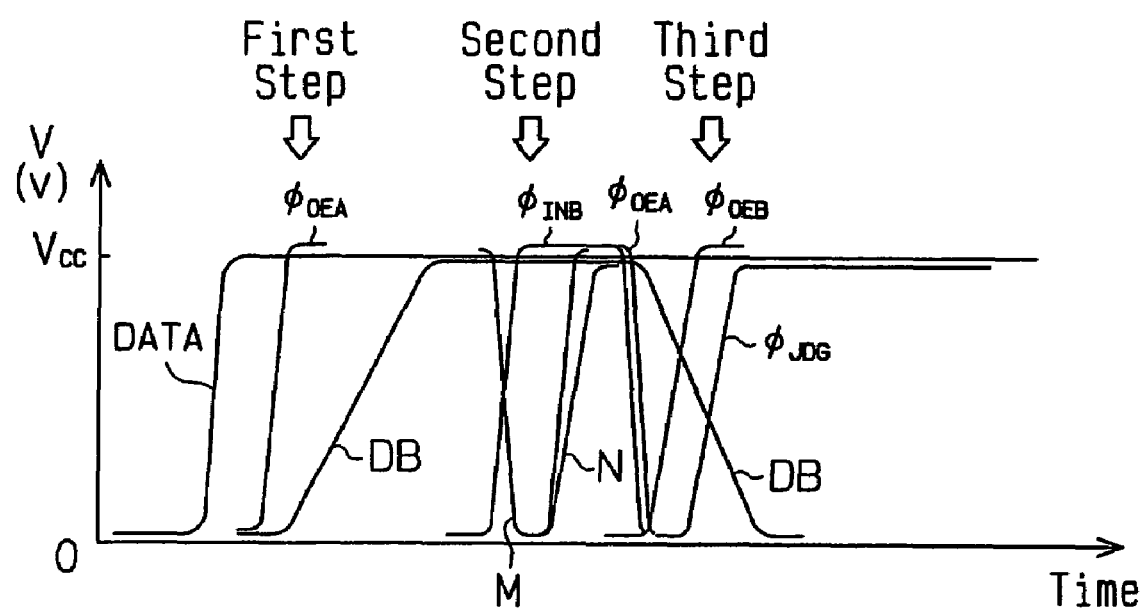
FIG. 4 is a signal wave-form chart illustrating the operation of the electronic device in FIG. 3.

The CPU 10 and the memory 30 enter the test mode in response to a test mode signal, and generate the DATA and the control signals φOEA, φINB, φOEB as shown in FIG. 4. The test process will now be described by dividing it into steps. The first step starts with the rise of the control signal OEA, the second step starts with the rise of the control signal φINB, and the third step starts with the rise of the control signal φOEB.

First, the CPU 10 selects a specific input/output pin Pa1–Pan in response to the test mode signal, sequentially in accordance with the physical address of the pin. That is, the internal circuit (not illustrated) of the CPU 10 supplies, after a specific time has passed since the input of the test mode signal, each of the data output units 11 with the DATA of the logical value "1", and sets the logical value of each of the input/output pins Pa1–Pan sequentially to "1". In other words, the internal circuit of the CPU 10 sequentially supplies the input/output pins Pa1–Pan with the logical values "1000 . . . 0", "0100 . . . 0", "0010 . . . 0", . . . , "0000 . . . 1". Hereinafter, the test process will be discussed with major focus on the input/output pin Pa1.

(1) When the CPU 10 and the memory 30 are properly connected:

case (1-1): The CPU 10 outputs DATA of the logical value "1".

In the first step, as the control signal φOEA rises, the PMOS transistor 16 and the NMOS transistor 17 are turned ON, and the inverter 13 is activated. The inverter 13 supplies the input/output pin Pa1 with the DATA of the logical value "1". The DATA of the logical value "1" are supplied to the latche 31 through the bus line DB1 and the input/output pin Pb1 of the memory 30.

In the second step, as the control signal φINB rises, during a specific time, the control signal M is maintained at the L level, and the reset circuit 36 is activated. The reset circuit 36 receives the DATA of the logical value "1", and resets the potential at the node N to the L level. After a delay time of the delay circuit 35c has passed, as the transfer gate 33 is supplied with the control signal φINB at the H level, the transfer gate 33 is made conductive, and the rise of the control signal M deactivates the inverter 36a. Then, the DATA are supplied to the latch circuit 34 through the transfer gate 33. The latch circuit 34 latches the DATA of the logical value "1", whereby the node N is maintained at a potential corresponding to the logical value "1". Thereafter, the control signal φOEA falls, and the inverter 13 is deactivated.

In the third step, as the control signal φOEB rises, the transfer gate 37 is made conductive, the inverter 39 is activated and supplied with the DATA latched by the latch circuit 34. The inverter 39 inverts the DATA of the logical value "1", and supplies the input/output pin Pb1 with the DATA of the logical value "0".

The DATA of the logical value "0" are supplied to the input/output pin Pa1 of the CPU 10 via the bus line DB1. The data comparison unit 12 compares the DATA of the logical value "0" with the DATA of the logical value "1" supplied by the CPU 10, and outputs the determination signal φJDG having a H level.

case (1-2): The CPU 10 outputs DATA of the logical value "0".

In the first step, the inverter 13 is activated by the control signal φOEA being high, and the DATA of the logical value "0" is supplied to the input/output pin Pa1.

In the second step, first, the reset circuit 36 is activated by the control signal φINB at the H level, and on the basis of the DATA of the logical value "0", the potential at the node N is reset to the L level. Thereafter, the transfer gate 33 is made conductive, and the latch circuit 34 latches the DATA of the logical value "0" from the input/output pin Pb1 and the transfer gate 33.

In the third step, the transfer gate 37 is made conductive by the control signal φOEB being at the H level, and the inverter 39 is activated. The inverter 39 supplies the input/output pin Pb1 with the DATA of the logical value "1". The data comparison unit 12 compares the DATA of the logical value "1" with the DATA of the logical value "0" supplied from the CPU 10, and outputs the determination signal φJDG having the H level.

In the cases (1-1) and (1-2), regardless of the logical value of the DATA output from the CPU 10, if the determination signal φJDG having the H level is output at the third step, the CPU 10 will determine that the input/output pins Pa1, Pb1, and the bus line DB1 are properly connected.

In the third step, the memory 30 sends back to the CPU 10 the DATA of the reverse logical value of the DATA sent to the bus line DB1 in the first step. Therefore, the connection test is not influenced by the residual charges on the bus lines DB1–DBn.

case (2-1): Short circuit failure due to proximity of the bus lines DB1–DBn or the input/output pins Pa1–Pan, Pb1–Pbn.

Suppose that there is a short circuit failure created between the input/output pins Pa1, Pb1 and the bus line DB1 with the logical value "1" output and the input/output pins Pa2, Pb2 and the bus line DB2 with the logical value "0" output. In this case, the potential variation at the input/output pin Pa1 is identical to the potential variation at the input/output pin Pa2. Accordingly, the logical value of the data at the input/output pin Pa2 changes opposite to that in the normal case. Therefore, in the third step, the logical value of the DATA coincides with the logical value of the data at the input/output pin Pa2, and the comparison unit 12 corresponding to the input/output pin Pa2 outputs the determination signal φJDG having the L level.

When the logical values of the input/output pins Pa1, Pb1, and the bus line DB1 are "0", and the logical values of the input/output pins Pa2, Pb2, and the bus line DB2 are "1", similarly, the logical value of the data at the input/output pin Pa1 changes opposite to that in the normal case. Therefore, in the third step, the logical value of the DATA coincides with the logical value of the data at the input/output pin Pa1, and the comparison unit 12 corresponding to the input/output pin Pa1 outputs the determination signal φJDG low.

The CPU 10 determines on the basis of the determination signal φJDG, that the connection between the CPU 10 and the memory 30 is incorrect at the input/output pins Pa1, Pa2 corresponding to the comparison unit 12.

case (2-2): The bus lines DB1–DBn or the input/output pins Pa1–Pan, Pb1–Pbn are short-circuited to the ground GND wiring or an input/output pin.

Suppose that the input/output pins Pa1, Pb1, and the bus line DB1 are short-circuited to the ground GND wiring or an input/output pin. In this case, if the drive capability of the inverter 13 (the output driver) is insufficient to overcome the leakage of the charges from the bus line DB1, the input/output pin Pa1 will always present the logical value "0". Accordingly, when the internal circuit outputs the DATA of the logical value "0", the logical values of the DATA and the input/output pin Pa1 are both "0" in the third step. Therefore, the comparison unit 12 corresponding to the input/output pin Pa1 outputs the determination signal φJDG low. The CPU 10 determines using the determination signal φJDG, that the connection between the CPU 10 and the memory 30 is incorrect at the input/output pin Pa1 corresponding to the comparison unit 12.

If the drive capability of the inverter 13 is sufficient to overcome the leakage of the charges from the bus line DB1, the logical value of the input/output pin Pa1 will change in the same manner as that in the normal case. However, if the drive capability of the inverter 39 is insufficient to overcome the leakage from the bus line DB1, the DATA of the logical value "1" will not be sent back to CPU 10, and the logical value of the input/output pin Pa1 will become "0". Accordingly, when the internal circuit outputs the DATA of the logical value "0", the logical values of the DATA and the input/output pin Pa1 become coincident at "0" in the third step, and the data comparison unit 12 corresponding to the input/output pin Pa1 outputs the determination signal φJDG low. Accordingly, the CPU 10 determines that the connection between the CPU 10 and the memory 30 is in failure at the input/output pin Pa1.

case (2-3): The bus lines DB1–DBn or the input/output pins Pa1–Pan, Pb1–Pbn are short-circuited to the high potential power supply Vcc wiring or an input/output pin.

Suppose that the input/output pins Pa1, Pb1, and the bus line DB1 are short-circuited to the high potential power supply Vcc wiring or an input/output pin. In this case, if the drive capability of the inverter 13 is insufficient to overcome the leakage from the bus line DB1, the input/output pin Pa1 will always present the logical value "1". Accordingly, when the internal circuit outputs the DATA of the logical value "1", the logical values of the DATA and the input/output pin Pa1 are coincident at "1" at the third step. Accordingly, the comparison unit 12 outputs the low determination signal φJDG and the CPU 10 determines on the basis of the determination signal φJDG, that the connection between the CPU 10 and the memory 30 is in failure at the input/output pin Pa1.

If the drive capability of the inverter 13 is sufficient to overcome the leakage of the charges from the bus line DB1, the logical value of the input/output pin Pa1 will change in the same manner as that in the normal case. However, if the drive capability of the inverter 39 is insufficient to overcome the leakage from the bus line DB1, the DATA of the logical value "0" will not be sent back to CPU 10, and the logical value of the input/output pin Pa1 will become "1". Accordingly, when the internal circuit outputs the DATA of the logical value "1", the logical value of the DATA and the logical value of the input/output pin Pa1 become coincident at "1" at the third step, and the data comparison unit 12 outputs the determination signal φJDG low. Accordingly, the CPU 10 determines that the connection between the CPU 10 and the memory 30 is in failure at the input/output pin Pa1.

In the cases (2-1)–(2-3), when the DATA of the logical value "1" or "0" are output from the internal circuit, if the low determination signal φJDG is output, the CPU 10 determines that the connection between the CPU 10 and the memory 30 is in failure.

(2) when the connection between the CPU 10 and the memory 30 is in open circuit failure:

Suppose that there is an open circuit failure between the CPU 10 and the memory 30 at the input/output pin Pa1.

If the internal circuit outputs the DATA of the logical value "1", the inverter 13 will be activated at the first step, and the logical value of the input/output pin Pa1 of the CPU 10 will become "1". However at the third step, since the DATA is not sent back to the input/output pin Pa1 of the CPU 10 from the memory 30, the logical value of the input/output pin Pa1 is maintained at "1". The logical value of the DATA from the internal circuit and the logical value of the input/output pin Pa1 are coincident at "1", and accordingly, the data comparison unit 12 outputs the low determination signal JDG.

When the internal circuit outputs the DATA of the logical value "0", the logical value of the input/output pin Pa1 is maintained at "0". Accordingly, the data comparison unit 12 outputs the low determination signal φJDG and the CPU 10 determines that the connection between the CPU 10 and the memory 30 is in failure at the input/output pin Pa1.

As mentioned above, regardless of the logical value of the DATA output from the internal circuit, if the high determination signal φJDG is output, the CPU 10 determines that the connection between the CPU 10 and the memory 30 is okay. In other words, if the low determination signal φJDG is output, the CPU 10 determines that there is an open circuit failure or a short circuit failure between the CPU 10 and the memory 30.

The electronic device 200 according to the first embodiment possesses several advantages as follows.

(1) First, at the first step, the DATA of the logical value "1" are output from the input/output pin Pa1–Pan that is selected in accordance with the physical address of the pin, and the DATA of the logical value "0" are output from the input/output pins Pa1–Pan that are not selected. At the second step, the DATA supplied to the input/output pins Pb1–Pbn are latched. At the third step, the data comparison unit 12 compares the logical value of the DATA supplied from the internal circuit with the logical value of the input/output pin Pa1–Pan that is sent back from the memory 30, and outputs the determination signal φJDG. On the basis of the determination signal JDG, a reliable determination can be made as to the open circuit failure or the short circuit failure in the bus lines DB1–DBn.

(2) The data of the opposite logical value of the logical value of the DATA supplied to the memory 30 from the CPU 10 are sent back to the CPU 10 from the memory 30. Therefore, the residual charges on the bus lines DB1–DBn do not have an adverse effect on the test.

(3) The connection test between the CPU 10 and the memory 30 is executed by sending and receiving DATA, with considerations for the drive capability of the output drivers (inverters 13, 39) of the CPU 10 and the memory 30. Thus, the detection by error due to the difference in the drive capability of the output drives of the CPU 10 and the memory 30 can be avoided.

(4) While sending and receiving DATA between the CPU 10 and the memory 30, the data comparison unit 12 of the CPU 10 executes the connection determination. Therefore, the open circuit and short circuit tests between the CPU 10 and the memory 30 are reliably made, while avoiding an increase of the circuit size of the memory 30.

(5) The latch 31 includes the reset circuit 36 that resets the latch circuit 34 on the basis of the DATA supplied to the input/output pins Pb1–Pbn. Therefore, the DATA previously latched by the latch circuit 34 does not remain in the latch circuit 34.

[Second Embodiment]

Figure 5:
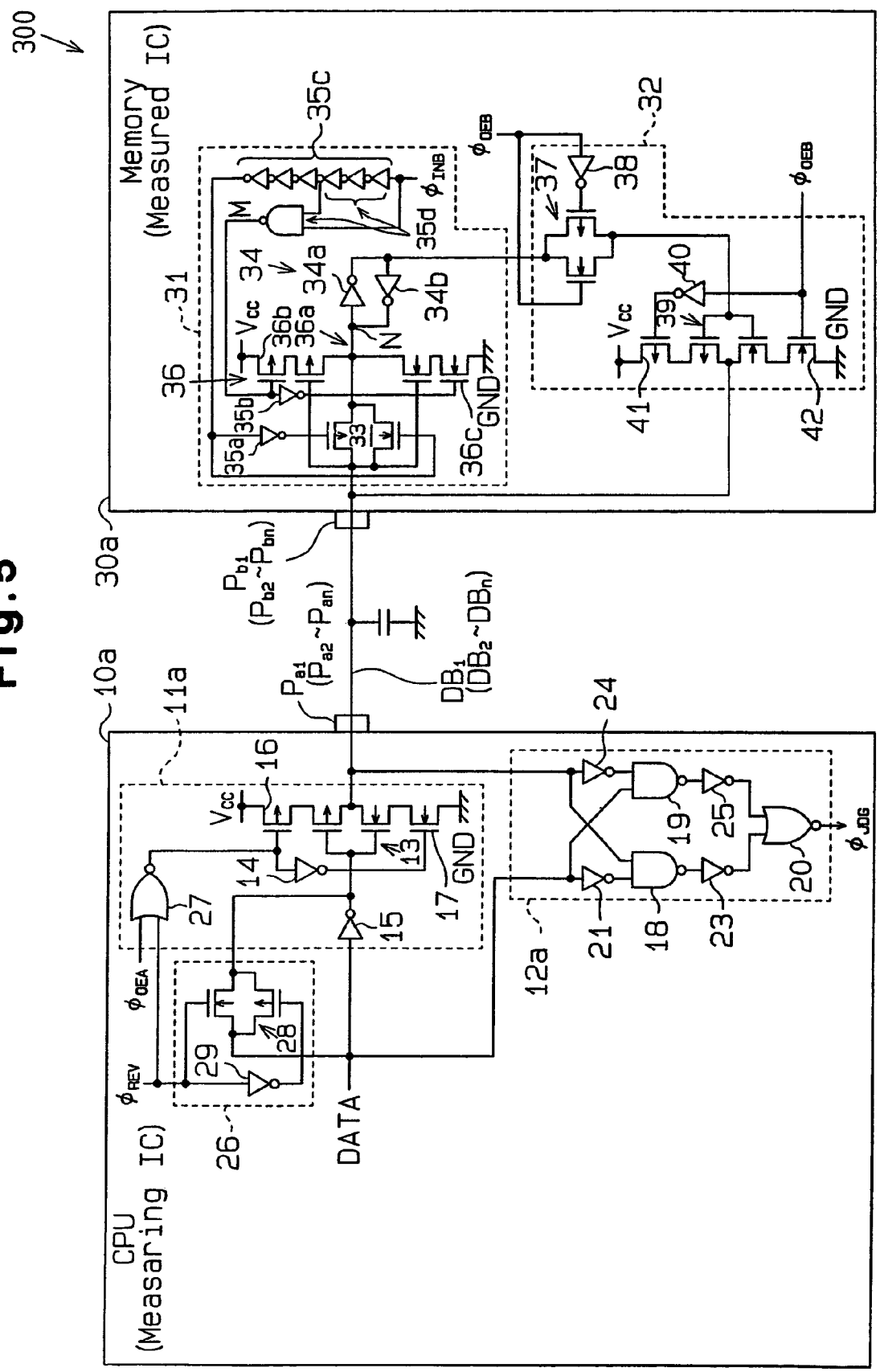
FIG. 5 is a schematic circuit diagram of an electronic device according to a second embodiment of the present invention.

FIG. 5 is a schematic circuit diagram of an electronic device 300 according to a second embodiment of the present invention. A CPU 10a includes plural data output units 11a, plural data comparison units 12a, and plural data inversion units 26. The plural data output units 11a and the plural data comparison units 12a are each connected to the input/output pins Pa1–Pan. Since each of the data output units 11a, each of the data comparison units 12a, and each of the data inversion units 26 each have the same circuit configuration, only the data output unit 11a, the data comparison unit 12a, and the data inversion unit 26 that are related to the input/output pin Pa1 will be discussed.

The data output unit 11a includes three inverters 13–15, MOS transistors 16, 17, and a NOR circuit 27. The NOR circuit 27 receives a control signal φOEA and a control signal φREV, and delivers a NOR logical signal to the gate of the PMOS transistor 16. The NOR logical signal is inverted by the inverter 14 and supplied to the gate of the NMOS transistor 17. As either the control signal φOEA or the control signal φREV rises, the inverter 13 is activated, and the DATA is supplied to the input/output pin Pa1.

The data comparison unit 12a includes two NAND circuits 18, 19, a NOR circuit 20, and four inverters 21, 23–25, while it does not includes the inverter 22. The data comparison unit 12a outputs the high determination signal φJDG, when the logical value of the DATA and the logical value of the input/output pin Pa1 are the same, and outputs the low determination signal φJDG, when they are not the same.

The data inversion unit 26 includes a CMOS type transfer gate 28 and an inverter 29. The transfer gate 28 is connected in parallel with the inverter 15. The gate of the PMOS transistor of the transfer gate 28 is supplied with the control signal φREV inverted by the inverter 29, and the gate of the NMOS transistor of the transfer gate 28 is supplied with the control signal φREV. When the control signal φREV is low, the transfer gate 28 is made nonconductive, and the DATA is inverted by the inverter 15 and then supplied to the inverter 13. As the control signal φREV goes high, the transfer gate 28 is made conductive, and the DATA is supplied to the inverter 13 through the transfer gate 28.

The memory 30a includes plural latches 31 and plural logical units 32, which are each connected to the input/output pins Pb1–Pbn. In the second embodiment, the output node of the latch circuit 34 is the output terminal of the inverter 34a, to which the transfer gate 37 is connected. When the high control signal φINB makes the transfer gate 33 conductive, the latch circuit 34 latches the DATA supplied to the input/output pin Pb1. When the high control signal φOEB makes the transfer gate 37 conductive and the inverter 39 is activated, the DATA of the same logical value as that of the DATA that was supplied to the input/output pin Pb1 from the inverter 39 is supplied to the input/output pin Pb1.

Figure 6:
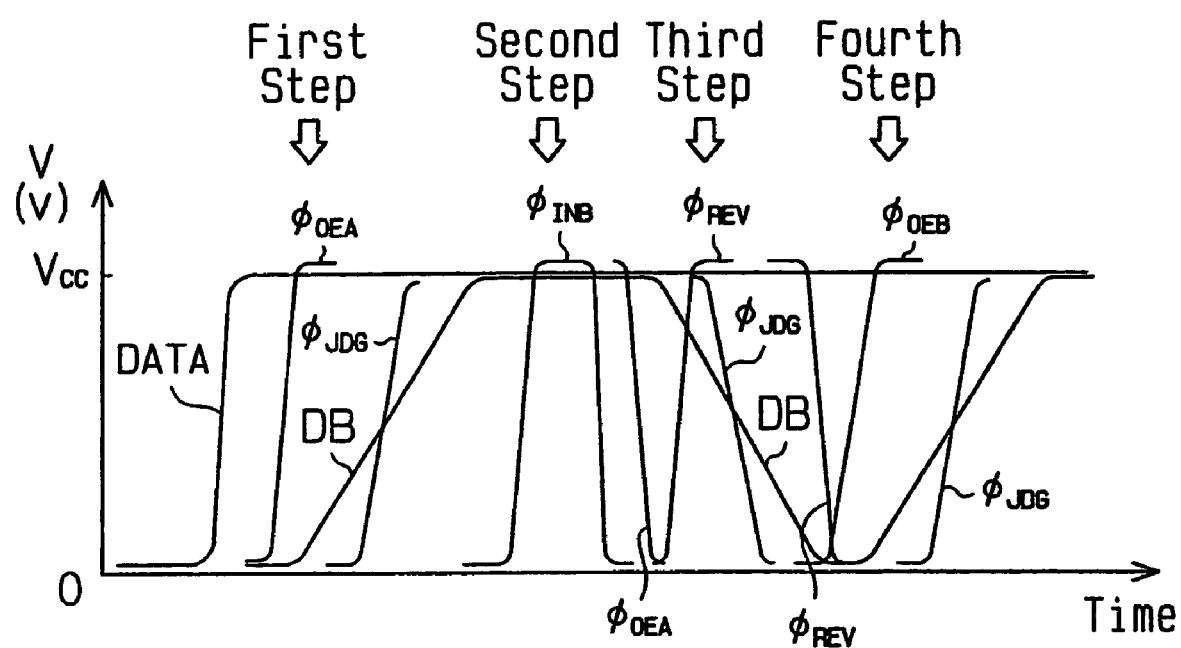
FIG. 6 is a signal wave-form chart illustrating the operation of the electronic device in FIG. 5.

The CPU 10a and the memory 30a enter the test mode in response to the test mode signal, and generate the DATA and the control signals φOEA, φINB, φREV, φOEB as shown in FIG. 6. The test process will now be described in steps, with the first step starting with the rise of the control signal φOEA, the second step starting with the rise of the control signal φINB, the third step starting with the rise of the control signal φREV, and the fourth step starting with the rise of the control signal φOEB.

First, in the same manner as the first embodiment, the internal circuit (not illustrated) of the CPU 10a sequentially supplies the data output units 11a corresponding to the input/output pins Pa1–Pan with the DATA of the logical value "1".

(1) When the CPU 10a and the memory 30a are properly connected:

case (1-1): DATA of the logical value "1" is output from the internal circuit of the CPU 10a.

In the first step, as the control signal φOEA rises, the PMOS transistor 16 and the NMOS transistor 17 are turned ON, and the inverter 13 is activated. At this moment, since the control signal φREV is low, the transfer gate 28 is made nonconductive. Accordingly, the inverter 13 supplies the input/output pin Pa1 with the DATA of the logical value "1". On the basis of the logical value "1" of the DATA and the logical value "1" of the input/output pin Pa1, the data comparison unit 12a outputs the high determination signal φJDG. The DATA of the logical value "1" is supplied to the latch 31 through the bus line DB1 and the input/output pin Pb1 of the memory 30a.

In the second step, as the control signal φINB rises, the control signal M is maintained at the L level, and the inverter 36a is activated. On the basis of the DATA of the logical value "1", the inverter 36a resets the potential at the node N low. Thereafter, when the transfer gate 33 is supplied with a delayed control signal φINB from the delay circuit 35c, the transfer gate 33 is made conductive, and the rise of the control signal M deactivates the inverter 36a. Then, the DATA supplied through the transfer gate 33 is latched by the latch circuit 34. Thereafter, the control signal φOEA falls, and the inverter 13 is deactivated.

In the third step, as the control signal φREV rises, the transfer gate 28 is made conductive, and the inverter 13 is activated. The inverter 13 receives the DATA of the logical value "1" through the transfer gate 28, and supplies the input/output pin Pa1 with the DATA of the logical value "0".

Accordingly, the bus line DB1 goes low. The data comparison unit 12a outputs the low determination signal φJDG, on the basis of the logical value "1" of the DATA and the logical value "0" of the input/output pin Pa1. Thereafter, as the control signal φREV falls, the transfer gate 28 is made nonconductive and the inverter 13 is deactivated.

In the fourth step, as the control signal φOEB rises, the transfer gate 37 is made conductive, and the inverter 39 is activated. The inverter 39 is supplied with the DATA latched by the latch circuit 34. The inverter 39 supplies the input/output pin Pb1 with the DATA of the same logical value "1" as the supplied DATA.

The DATA of the logical value "1" are supplied to the input/output pin Pa1 through the bus line DB1. The data comparison unit 12a compares the DATA of the logical value "1" that has been sent back thereto with the DATA of the logical value "1" that has been supplied from the internal circuit, and outputs the high determination signal φJDG.

case (1-2): DATA of the logical value "0" is output from the internal circuit of the CPU 10a.

In the same manner as the case (1-1), in the first step, the high control signal φOEA activates the inverter 13, and the DATA of the logical value "0" are supplied to the input/output pin Pa1.

In the second step, the high control signal φINB activates the reset circuit 36, and the potential of the node N is reset to low. Thereafter, the transfer gate 33 is made conductive, and the latch circuit 34 latches the DATA supplied through the input/output pin Pb1 and the transfer gate 33.

In the third step, the inverter 13 receives the DATA of the logical value "0" through the transfer gate 28 that was made conductive by the high control signal φREV, and supplies the input/output pin Pa1 with the DATA of the logical value "1".

In the fourth step, the transfer gate 37 is made conductive by the high control signal φOEB, and the inverter 39 is activated. Then, the inverter 39 supplies the input/output pin Pb1 with the DATA of the logical value "0". The data comparison unit 12a compares the DATA of the logical value "0" that has been sent back thereto with the DATA of the logical value "0" that has been supplied from the internal circuit of the CPU 10a, and outputs the high determination signal φJDG.

On the basis of the high determination signal φJDG in the fourth step, the CPU 10a determines that the input/output pins Pa1, Pb1, and the bus line DB1 are properly connected.

When the memory 30a sends back the DATA to the CPU 10a in the fourth step, the data of the opposite logical value of the DATA in the third step are supplied to the bus lines DB1–DBn. Therefore, any residual charges on the bus lines DB1–DBn do not adversely effect the connection test.

case (2-1): Short circuit failure due to proximity of the bus lines DB1–DBn or the input/output pins Pa1–Pan, Pb1–Pbn.

Suppose that there is a short circuit failure between the input/output pins Pa1, Pb1 and the bus line DB1 with the logical value "1" output and the input/output pins Pa2, Pb2 and the bus line DB2 with the logical value "0" output. In this case, the potential at the input/output pin Pa1 changes in the same manner as the potential at the input/output pin Pa2. Accordingly, the logical value of the data at the input/output pin Pa2 changes opposite to that in the normal case. Therefore, in the fourth step, the logical value of the DATA is not the same as the data at the input/output pin Pa2, and the comparison unit 12a corresponding to the input/output pin Pa2 outputs the low determination signal φJDG.

Similarly, when the logical values of the input/output pins Pa1, Pb1, and the bus line DB1 are "0", and the logical values of the input/output pins Pa2, Pb2, and the bus line DB2 are "1", the logical value of the data at the input/output pin Pa1 changes opposite to that in the normal case. Therefore, at the fourth step, the logical value of the DATA is no longer equal to the logical value of the input/output pin Pa1, and the comparison unit 12a corresponding to the input/output pin Pa1 outputs the low determination signal φJDG. On the basis of the low determination signal φJDG, the CPU 10a determines that the connection between the CPU 10a and the memory 30a has failed at the input/output pins Pa1, Pa2.

case (2-2): the bus lines DB1–DBn or the input/output pins Pa1–Pan, Pb1–Pbn are short-circuited to the ground GND wiring or an input/output pin.

In this case, if the drive capability of the inverter 13 is insufficient to overcome the leakage of the charges from the bus line DB1, the input/output pin Pa1 will always present the logical value "0". Accordingly, when the internal circuit outputs the DATA of the logical value "1", the logical value "1" of the DATA and the logical value "0" of the input/output pin Pa1 will not be equal at the fourth step. Therefore, the comparison unit 12a corresponding to the input/output pin Pa1 outputs the low determination signal φJDG. The CPU 10a determines on the basis of the low determination signal φJDG, that the connection between the CPU 10a and the memory 30a has failed at the input/output pin Pa1.

If the drive capability of the inverter 13 is sufficient to overcome the leakage of the charges from the bus line DB1, the logical value of the input/output pin Pa1 will change in the same manner as that in the normal case. However, if the drive capability of the inverter 39 is insufficient to overcome the leakage from the bus line DB1, the DATA of the logical value "1" will not be sent back to CPU 10a. Accordingly, the logical value of the input/output pin Pa1 is maintained at "0" at the fourth step. That is, the logical value "1" of the DATA and the logical value "0" of the input/output pin Pa1 are unequal at the fourth step, and the data comparison unit 12a corresponding to the input/output pin Pa1 outputs the low determination signal φJDG. On the basis of the low determination signal φJDG, the CPU 10a determines that the connection between the CPU 10a and the memory 30a has failed at the input/output pin Pa1.

case (2-3): the bus lines DB1–DBn or the input/output pins Pa1–Pan, Pb1–Pbn are short-circuited to the high potential power supply Vcc wiring or an input/output pin.

In this case, if the drive capability of the inverter 13 is insufficient to overcome the leakage from the bus line DB1, the input/output pins Pa1–Pan will always have the logical value "1". Accordingly, the logical value "0" of the DATA output by the internal circuit is unequal to the logical value "1" of the input/output pin Pa1, and the comparison unit 12a outputs the low determination signal φJDG at the fourth step. The CPU 10a determines on the basis of the low determination signal φJDG, that the connection between the CPU 10a and the memory 30a has failed at the input/output pin Pa1.

If the drive capability of the inverter 13 is sufficient to overcome the leakage of the charges from the bus line DB1, the logical value of the input/output pin Pa1 will change in the same manner as that in the normal case. However, if the drive capability of the inverter 39 is insufficient to overcome the leakage from the bus line DB1, the DATA of the logical value "0" will not be sent back to CPU 10a. Accordingly, the logical value of the input/output pin Pa1 is maintained at "1" at the fourth step. Therefore, the logical value "0" of the DATA output by the internal circuit and the logical value "1" of the input/output pin Pa1 are unequal, and the data comparison unit 12a outputs the low determination signal φJDG. Accordingly, the CPU 10*a* determines that the connection between the CPU 10*a* and the memory 30*a* has failed at the input/output pin Pa1.

Thus, when the DATA of the logical value "1" or "0" are output from the internal circuit, if the low determination signal φJDG is output at the fourth step, the CPU 10*a* determines that the connection between the CPU 10*a* and the memory 30*a* has failed.

(3) when the connection between the CPU 10*a* and the memory 30*a* is in open circuit failure:

Suppose that there is an open circuit failure between the input/output pins Pa1 and Pb1. If the inverter 13 is activated at the first step, the input/output pin Pa1 of the CPU 10*a* is supplied with the DATA of the logical value "1". At the third step, the input/output pin Pa1 is supplied with the DATA of the logical value "0" by means of the operation of the data inversion unit 26. However at the fourth step, since the DATA is not sent back to the input/output pin Pa1 of the CPU 10*a* from the memory 30*a*, the logical value of the input/output pin Pa1 is maintained at "0". Accordingly, the logical value "1" of the DATA from the internal circuit and the logical value "0" of the input/output pin Pa1 are unequal, and the data comparison unit 12*a* outputs the low determination signal φJDG.

When the internal circuit outputs the DATA of the logical value "0", the logical value of the input/output pin Pa1 is maintained at "1" at the fourth step. Accordingly, the data comparison unit 12*a* outputs the low determination signal φJDG, as the DATA of the logical value "0" and the logical value "1" of the input/output pin Pa1 are unequal. The CPU 10*a* determines on the basis of the low determination signal φJDG, that the connection between the CPU 10*a* and the memory 30*a* has failed at the input/output pin Pa1. That is, regardless of the logical value of the DATA output from the internal circuit, if the low determination signal φJDG is output at the fourth step, the CPU 10*a* determines that there is a connection failure between the CPU 10*a* and the memory 30*a*.

The electronic device 300 relating to the second embodiment possesses several advantages as follows.

(1) In the first step, the DATA of the logical value "1" are output from the input/output pin Pa1–Pa*n* that is selected in accordance with the physical address, and the DATA of the logical value "0" are output from the input/output pins Pa1–Pa*n* that are not selected. At the second step, the DATA supplied to the input/output pins Pb1–Pb*n* are latched. At the third step, the DATA from the internal circuit are inverted, and the inverted DATA are supplied to the input/output pins Pa1–Pa*n*. At the fourth step, the data comparison unit 12*a* compares the logical value of the DATA supplied from the internal circuit with the logical value of the data sent back from the memory 30*a*, and generates the determination signal φJDG. On the basis of the determination signal φJDG, a reliable determination can be made as to the open circuit failure or the short circuit failure of the bus lines DB1–DB*n*.

(2) The data of the opposite logical value of the DATA supplied to the bus lines DB1–DB*n* at the third step are sent back to the CPU 10*a* from the memory 30*a* at the fourth step. Therefore, the residual charges on the bus lines DB1–DB*n* do not influence the connection test.

(3) While consideration is paid to the drive capability of the output drivers (inverters 13, 39) of the CPU 10*a* and the memory 30*a*, the connection test is performed by sending and receiving the DATA between the CPU 10*a* and the memory 30*a*. Therefore, the detection by error due to the difference in the drive capability of the output drive is avoided.

(4) Since the data comparison unit 12*a* is provided inside the CPU 10*a*, while avoiding an increase of the circuit size of the memory 30*a*, the data comparison unit 12*a* reliably executes the open circuit and short circuit test between the CPU 10*a* and the memory 30*a*.

[Third Embodiment]

Figure 7:
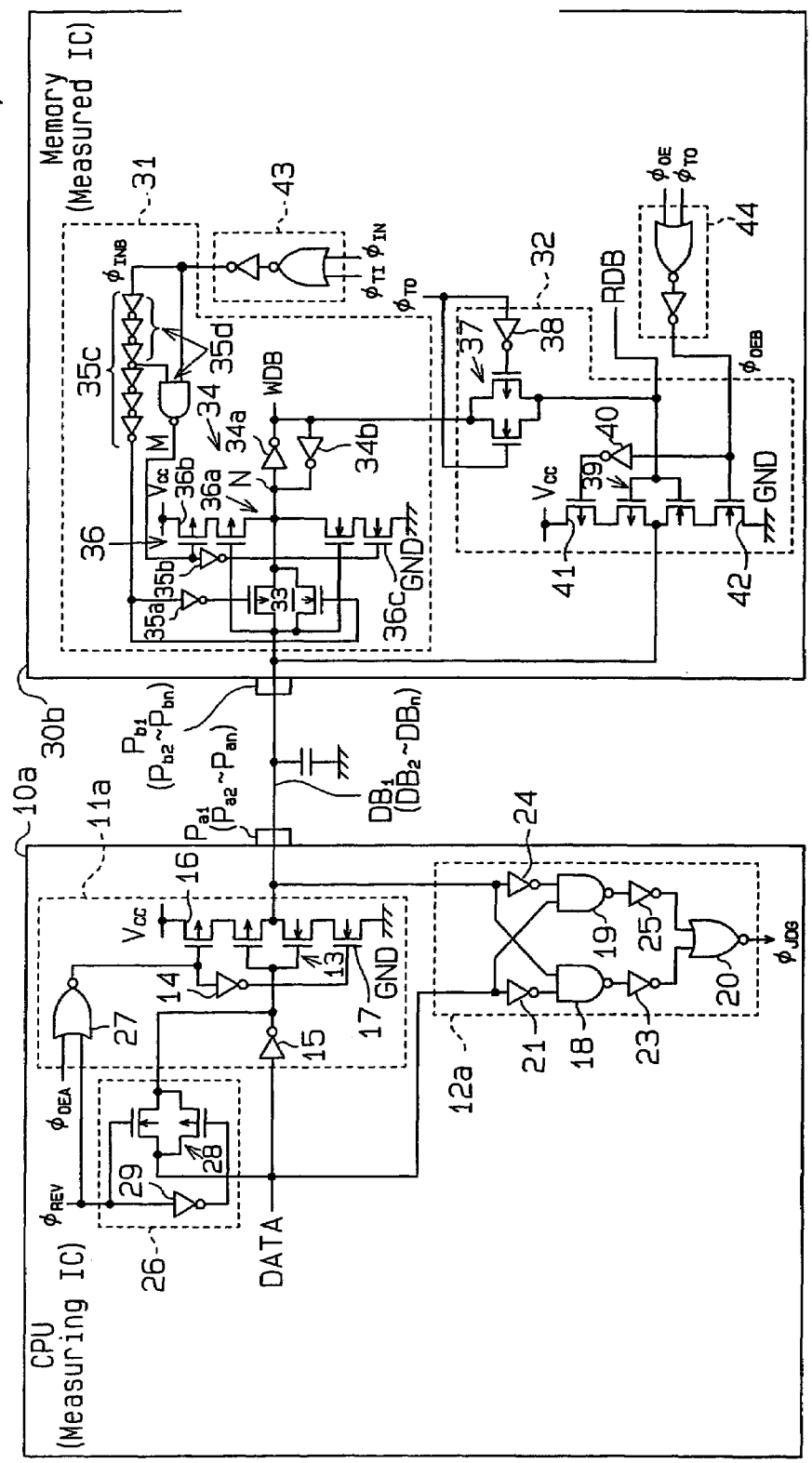
FIG. 7 is a schematic circuit diagram of an electronic device according to a third embodiment of the invention.

FIG. 7 is a schematic circuit diagram of an electronic device 400 according to a third embodiment of the invention. The memory 30*b* includes two OR circuits 43, 44. The OR circuit 43 receives a test mode control signal φTI and a normal mode control signal φIN, and generates the control signal φINB for switching the transfer gate 33 into the conductive or nonconductive state. The output terminal of the inverter 34*a* is connected to the internal circuit (not illustrated) through a write internal bus line WDB.

In the test mode, the memory 30*b* executes the test mode operation by the test mode control signal φTI controlling the conductive or nonconductive state of the transfer gate 33. In the normal mode, the write data supplied to the input/output pins Pb1–Pb*n* are supplied to the internal circuit through the transfer gate 33, latch circuit 34, and the write internal bus line WDB, by means of the normal mode control signal φIN that controls the conductive or nonconductive state of the transfer gate 33.

The OR circuit 44 receives a test mode control signal φTO and a normal mode control signal φOE, and generates the control signal φOEB for switching the inverter 39 into the active or inactive state. The input terminal of the inverter 39 is connected to the internal circuit through a read internal bus line RDB. The gate of the PMOS transistor of the transfer gate 37 is supplied with the test mode control signal φTO inverted by the inverter 38, and the gate of the NMOS transistor of the transfer gate 37 is supplied with the test mode control signal φTO.

In the test mode, the memory 30*b* executes the test mode operation by the test mode control signal φTO that controls the active or inactive state of the inverter 39 and the conductive or nonconductive state of the transfer gate 37. In the normal mode, the read data read by the read internal bus line RDB are supplied to the input/output pins Pb1–Pb*n* by means of the normal mode control signal 10E that controls the active or inactive state of the inverter 39.

Thus, in the third embodiment, since the latch 31 and the logical unit 32 of the memory 30*b* are shared by the test mode and the normal mode, the circuit size of the memory 30*b* is prevented from increasing. The OR circuits 43, 44 may be applied to the electronic device 200 of the first embodiment.

The electronic device of the first through third embodiments may be modified as follows.

(a) The internal circuits of the CPU 10, 10*a* supply the input/output pins Pa1–Pa*n* with the data of the logical values "1000 . . . 0", "0100 . . . 0", "0010 . . . 0", . . . , "0000 . . . 1" to execute the connection test. However, the test may be carried out according to the following (I)–(IV).

(I) The internal circuit of the CPU 10 may supply the input/output pins with the data of the logical values "1010 . . . 10", "0101 . . . 101". That is, the logical values of data supplied to adjoining input/output pins may be designed to be different. Make the logical values of the adjoining input/output pins different will detect short circuits between the adjoining input/output pins (or, bus lines). In this case, since plural input/output pins are simultaneously supplied with data of the logical value "1", the testing time is shortened.

(II) The internal circuit of the CPU may supply the input/output pins with the data of the logical values "1100 . . . 00", "0011 . . . 11". That is, each of the logical values of data supplied to each of plural input/output pins may be made different. This arrangement will detect short circuits between the plural input/output pins selected and the plural input/output pins (or, bus lines) not selected.

(III) The configuration may be made to operate the data output unit, data comparison unit, latch, and logical unit (data inversion unit) corresponding to a specific input/output pin, and to operate only the data comparison unit corresponding to the other input/output pins.

(IV) The test may be executed to supply data to a specific bus line and input/output pin, while the other bus lines and input/output pins are maintained at a logical value reverse to the logical value of the data supplied to the specific bus line. This will also make the connection determination possible.

(b) The reset circuit 36 for resetting the latch circuit 34 may be omitted.

(C) The CPU 10, 10a may be measured semiconductor devices, and the memories 30, 30a, 30b may be measuring semiconductor devices. The present invention may be applied to the semiconductor devices other than the CPU 10, 10a and the memories 30, 30a, 30b.

(d) The test may be carried out with a configuration of one measuring semiconductor device against plural measured semiconductor devices. In this case, any one of the plural measured semiconductor devices is activated, and the test is executed between the activated measuring semiconductor device and the activated measured semiconductor device.

(e) The connection determination between the devices may be made on the basis of the output result of the determination signal φJDG at each step.

(f) The reset circuit 36 may be designed to reset the latch circuit 34 on the basis of an instruction signal from the external circuit.

(g) The circuit configurations of the data output unit 11, data comparison unit 12, latch 31, and logical unit 32 in FIG. 3 may be modified, as long as the operations are functionally the same.

(h) The circuit configurations of the data output unit 11a, data comparison unit 12a, data inversion unit 26, latch 31, and logical unit 32 in FIG. 5 may be modified, as long as the operations are functionally the same.

[Fourth Embodiment]

A fourth embodiment of the invention will now be discussed.

Figure 8:
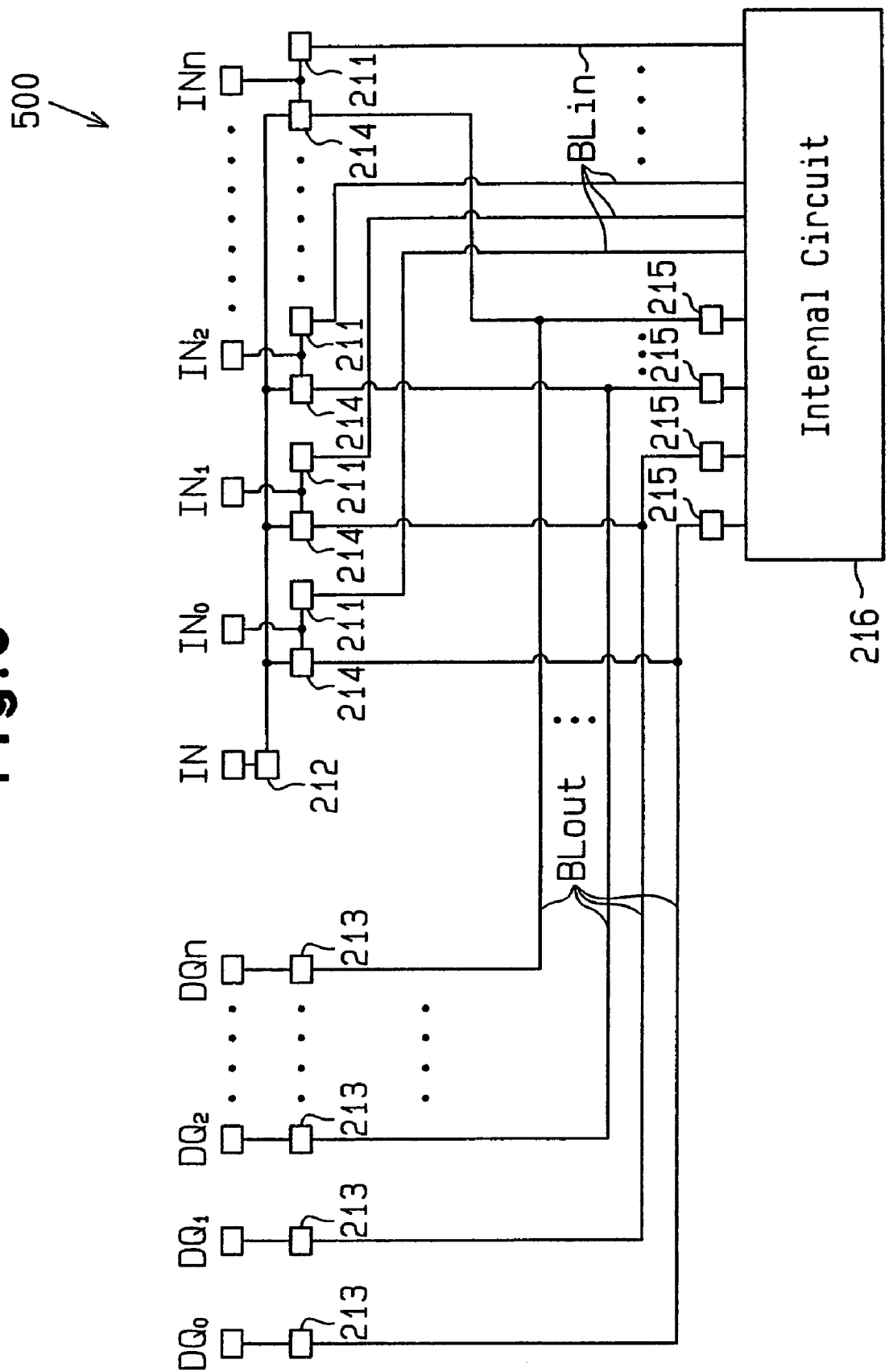
FIG. 8 is a schematic diagram of a SDRAM according to a fourth embodiment of the present invention.

FIG. 8 is a schematic circuit diagram of a Synchronous Dynamic Random Access Memory (SDRAM) 500 relating to the fourth embodiment of the invention. The SDRAM 500 is formed in a chip size package (CSP).

The SDRAM 500 includes input pads IN0–INn, a test input pad IN, output pads DQ0–DQn, input buffers 211, a test input buffer 212, output buffers 213, test circuits 214, bus drive circuits 215, and an internal circuit 216. The internal circuit 216 includes a memory cell array (not illustrated), receives signals supplied from the input pads IN0–INn, and outputs response signals.

The input pads IN0–INn are each connected to the input buffers 211, and the input buffers 211 are connected to the internal circuit 216 through internal bus lines BLin. The output pads DQ0–DQn are each connected to the output buffers 213, and the output buffers 213 are each connected to the bus drive circuits 215 through internal bus lines BLout. The bus drive circuits 215 are connected to the internal circuit 216.

The input pads IN0–INn are each connected to the test circuits 214, and the test circuits 214 receive test signals from an external device through the input pads IN0–INn.

The test input pad IN is connected to each of the test circuits 214 through the test input buffer 212, and the test circuits 214 receive the test signals from the external device through the input pad IN. The test circuits 214 are each connected to the internal bus lines BLout.

Figure 9:
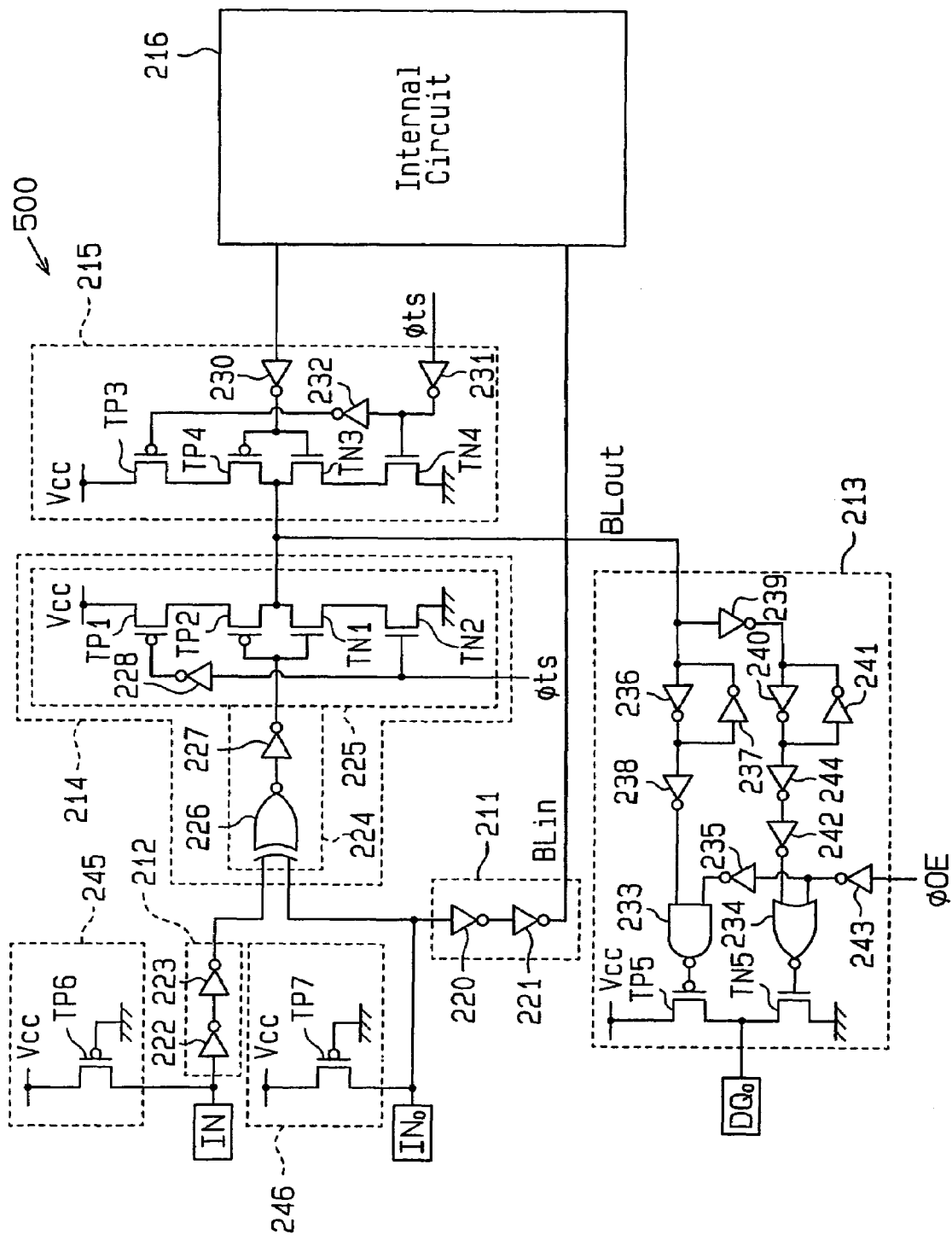
FIG. 9 is a circuit diagram of each block of the SDRAM in FIG. 8.

FIG. 9 is a more detailed circuit diagram of the SDRAM 500. The input buffer 211 includes two inverters 220, 221 connected in series, and supplies a signal from the input pad IN0 to the internal circuit 216 through the internal bus line BLin.

The test input buffer 212 includes two inverters 222, 223 connected in series, and supplies a signal from the test input pad IN to the test circuit 214. The test circuit 214 includes an input logical circuit 224 and a bus drive circuit 225.

The input logical circuit 224 includes an exclusive NOR circuit 226 and an inverter 227. The first input terminal of the exclusive NOR circuit 226 is connected to the output terminal of the test input buffer 212, and the second input terminal is connected to the input pad IN0. The output terminal of the exclusive NOR circuit 226 is connected to the bus drive circuit 225 through the inverter 227. When the input signal level from the input pad IN0 and the input signal level from the test input pad IN are equal, the input logical circuit 224 supplies a L level signal to the bus drive circuit 225, and when the input signal levels are not equal, it supplies a H level signal to the bus drive circuit 225. In this manner, the input logical circuit 224 performs the logical operation with the signal supplied from the input pads IN0–INn and the signal supplied from the test input pad IN, and supplies the logical signal to the bus drive circuit 225.

The bus drive circuit 225 includes an inverter 228, and two PMOS transistors TP1, TP2 and two NMOS transistors TN1, TN2 which are connected in series between the high potential power supply Vcc and the ground (low potential power supply). The logical signal from the input logical circuit 224 is supplied to each of the gates of the PMOS transistor TP2 and NMOS transistor TN1. A test activation signal (hereafter, test signal) φts is supplied to the gate of the NMOS transistor TN2. The test signal φts inverted by the inverter 228 is supplied to the gate of the PMOS transistor TP1.

The test signal φts is generated inside the SDRAM 500 on the basis of a specific command signal supplied from an external device, such as a memory controller, which is set to the H level in the test mode and to the L level in the normal operation mode.

The bus drive circuit 225 is activated by the high test signal φts, and receives the low logical signal from the input logical circuit 224 to output a high drive signal. Further, the bus drive circuit 225 receives the high logical signal from the input logical circuit 224 to output a low drive signal. The bus drive circuit 225 is deactivated by the low test signal φts, so that the output terminal of the bus drive circuit 225 is brought to a high impedance.

The bus drive circuit 215 includes three inverters 230–232, and two PMOS transistors TP3, TP4 and two NMOS transistors TN3, TN4 which are connected in series between the high potential power supply Vcc and the ground. The output signal from the internal circuit 216 inverted by the inverter 230 is supplied to each gate of the PMOS transistor TP4 and the NMOS transistor TN3. The test signal φts is supplied to the gate of the PMOS transistor TP3 through the two inverters 231 and 232, and the test signal φts inverted by the inverter 231 is supplied to the gate of the NMOS transistor TN4.

The bus drive circuit 215 is activated by the low test signal φts, and receives the high signal from the internal circuit 216 to output the high drive signal. Further, the bus drive circuit 215 receives the low signal from the internal circuit 216 to output the low drive signal. The bus drive circuit 215 is deactivated by the high test signal φts, so that the output terminal of the bus drive circuit 215 is brought to a high impedance.

The test signal φts is set to the H level in the conductive test mode, and it is set to the L level in the other mode. In the conductive test mode, the bus drive circuit 215 is deactivated to cut off inputting the output signal from the internal circuit 216, and the bus drive circuit 225 is activated to receive the logical signal from the input logical circuit 224 and supply the drive signal to the output buffer 213 through the internal bus line BLout. In a mode other than the conductive test mode, the bus drive circuit 225 is deactivated to cut off inputting the logical signal from the input logical circuit 224, and the bus drive circuit 215 is activated to receive the signal from the internal circuit 216 and supply the drive signal to the output buffer 213 through the internal bus line BLout.

The output buffer 213 includes a PMOS transistor TP5 and an NMOS transistor TN5 connected in series between the high potential power supply Vcc and the ground, a NAND circuit 233, a NOR circuit 234, and ten inverters 235–244. The output pad DQ0 is connected to a node between the PMOS transistor TP5 and the NMOS transistor TN5. The output terminal of the NAND circuit 233 is connected to the gate of the PMOS transistor TP5, and the output terminal of the NOR circuit 234 is connected to the gate of the NMOS transistor TN5.

The drive signal transmitted by the internal bus line BLout passes through a latch circuit formed of the two inverters 236, 237, and the inverter 238 to be supplied to the first input terminal of the NAND circuit 233, and an output activation signal φOE passes through the inverters 243, 235 to be supplied to the second input terminal of the NAND circuit 233. The drive signal passes through the inverter 239, a latch circuit formed of the two inverters 240, 241, and the two inverters 244, 242 to be supplied to the first input terminal of the NOR circuit 234, and the output activation signal φOE passes through the inverter 243 to be supplied to the second input terminal of the NOR circuit 234.

The output activation signal φOE supplied to the NAND circuit 233 and the NOR circuit 234 activates the output buffer 213. The activated output buffer 213 receives the drive signal from the bus drive circuit 215 or the bus drive circuit 225 to deliver a signal to the output pad DQ0. Consequently, the output buffer 213 receives the high drive signal to deliver the high signal, and receives the low drive signal to deliver the low signal. When the output buffer 213 is deactivated, the output pad DQ0 is brought to a high impedance.

The SDRAM 500 includes clamp circuits 245, 246. Preferably, the clamp circuit 245 is connected between the high potential power supply Vcc and the node between the test input pad IN and the test input buffer 212, and includes a PMOS transistor TP6 whose gate is grounded. Preferably, the clamp circuit 246 is connected between the high potential power supply Vcc and the node between the input pad IN0 and the input buffer 211, and includes a PMOS transistor TP7 whose gate is grounded.

The clamp circuit 245 clamps the potential of the test input pad IN in the open state to the high potential power supply Vcc level (H level). The clamp circuit 246 clamps the potential of the input pad IN0 in the open state to the high potential power supply Vcc level (H level). Since the drive currents running through the PMOS transistors TP6, TP7 are very low, the potential levels of the input pads IN, IN0 are set to L or H level in accordance with a signal from the external device. The clamp circuits 245, 246 may clamp the input pads IN, IN0–INn to the ground level. In this case, the clamp circuits preferably include NMOS transistors whose gates are supplied with high level signals.

Next, the operation of the SDRAM 500 will be described.

In the test mode, the SDRAM 500 generates the high test signal ts. Then, the bus drive circuit 225 is activated, and the bus drive circuit 215 is deactivated. The output buffer 213 is activated by the output activation signal φOE. Next, the external device (not illustrated) supplies a high test signal to the test input pad IN and the input pads IN0–INn. Here, the external device may bring the output terminals thereof corresponding to all of the pads IN, IN0–INn to a high impedance. In this case, even if the input pads IN, IN0–INn are disconnected (nonconductive) with the wiring on the board, the clamp circuits 245, 246 set the potentials of the input pads IN, IN0–INn to the H level. The input logical circuit 224 receives two H level input signals, and since they are the same, it delivers the low logical signal to the bus drive circuit 225. The bus drive circuit 225 supplies the high drive signal to the output buffer 213 through the internal bus BLout, and the output buffer 213 supplies the high response signal to the external device through the output pads DQ0–DQn. At this moment, if the external device receives the response at the L level, it will confirm that the output pad corresponding to that response signal not connected with the wiring on the board.

Next, the external device supplies the test input pad IN with the low signal, while continuing to supply the input pads IN0–INn with the high signal. At this moment, if the response signal supplied to the external device from the output pads DQ0–DQn changes, it confirms the connection of the test input pad IN and the output pads DQ0–DQn.

To be specific, if the test input pad IN is connected to the wiring on the board, the low signal will be supplied to the first input terminal of the input logical circuit 224 through the test input pad IN, and the high signal is supplied to the second input terminal of the input logical circuit 224 through the input pads IN0–INn. Since these two input signals are not the same, the input logical circuit 224 supplies the high logical signal to the bus drive circuit 225. The bus drive circuit 225 supplies the low drive signal to the output buffer 213 through the internal bus line BLout, and the output buffer 213 supplies the low response signal to the external device through the output pads DQ0–DQn.

If the test input pad IN is disconnected, the test input pad IN will be set to the H level by the clamp circuit 245, and the high signal is supplied to the input logical circuit 224. In this case, since the input signals are the same, the input logical circuit 224 supplies the low logical signal to the bus drive circuit 225. The bus drive circuit 225 supplies the high drive signal to the output buffer 213 through the internal bus line BLout, and the output buffer 213 supplies the high response signal to the external device through the output pads DQ0–DQn.

Therefore, if the response signal supplied to the external device from the output pads DQ0–DQn turns from H level to L level, it confirms the connection of the test input pad IN and the output pads DQ0–DQn. If the response signal does not change the level, it confirms that the output pads DQ0–DQn corresponding to the response signal not showing the level variation are disconnected with the wiring on the board. Thus, the connection of the test input pad IN and the output pads DQ0–DQn is confirmed on the basis of the response signal level output from the output pads DQ0–DQn.

Next, the external device supplies the test input pad IN with the high signal. At this moment, if the response signal supplied to the external device from the output pads DQ0–DQn changes the level, it confirms the connection of the input pads IN0–INn. If the response signal does not change the level, it confirms that the input pads IN0–INn are disconnected.

Thereafter, the test signal φts is turned to the L level, and when the conductive test mode is shifted to the normal operation mode, the bus drive circuit 225 is deactivated, and the bus drive circuit 215 is activated. Therefore, the signal from the test circuit 214 is cut off, and the signal from the internal circuit 216 passes through the bus drive circuit 215, internal bus line BLout, output buffer 213, and output pads DQ0–DQn to be supplied to the external device.

The SDRAM 500 of the fourth embodiment possesses the following advantages.

(1) In the normal operation mode, the bus drive circuit 215 is activated, and the bus drive circuit 225 is deactivated, whereby the signal from the internal circuit 216 is supplied to the external device through the internal bus line BLout and the output buffer 213. In the conductive test mode, the bus drive circuit 225 is activated, and the bus drive circuit 215 is deactivated, whereby the logical processes are applied to the input signals supplied to the input pads IN, IN0–INn, and the response signal is supplied to the external device through the internal bus line BLout and the output buffer 213. Thus, the conductive test is carried out using the internal bus line BLout and the output buffer 213 that transmit the output signal in the normal operation mode. This leads to restricting an increase of the chip size due to the circuit for the conductive test.

(2) Since the input pads IN, IN0–INn are clamped by the clamp circuits 245, 246, the test circuits 214 do not malfunction during the conductive test.

[Fifth Embodiment]

Figure 10:
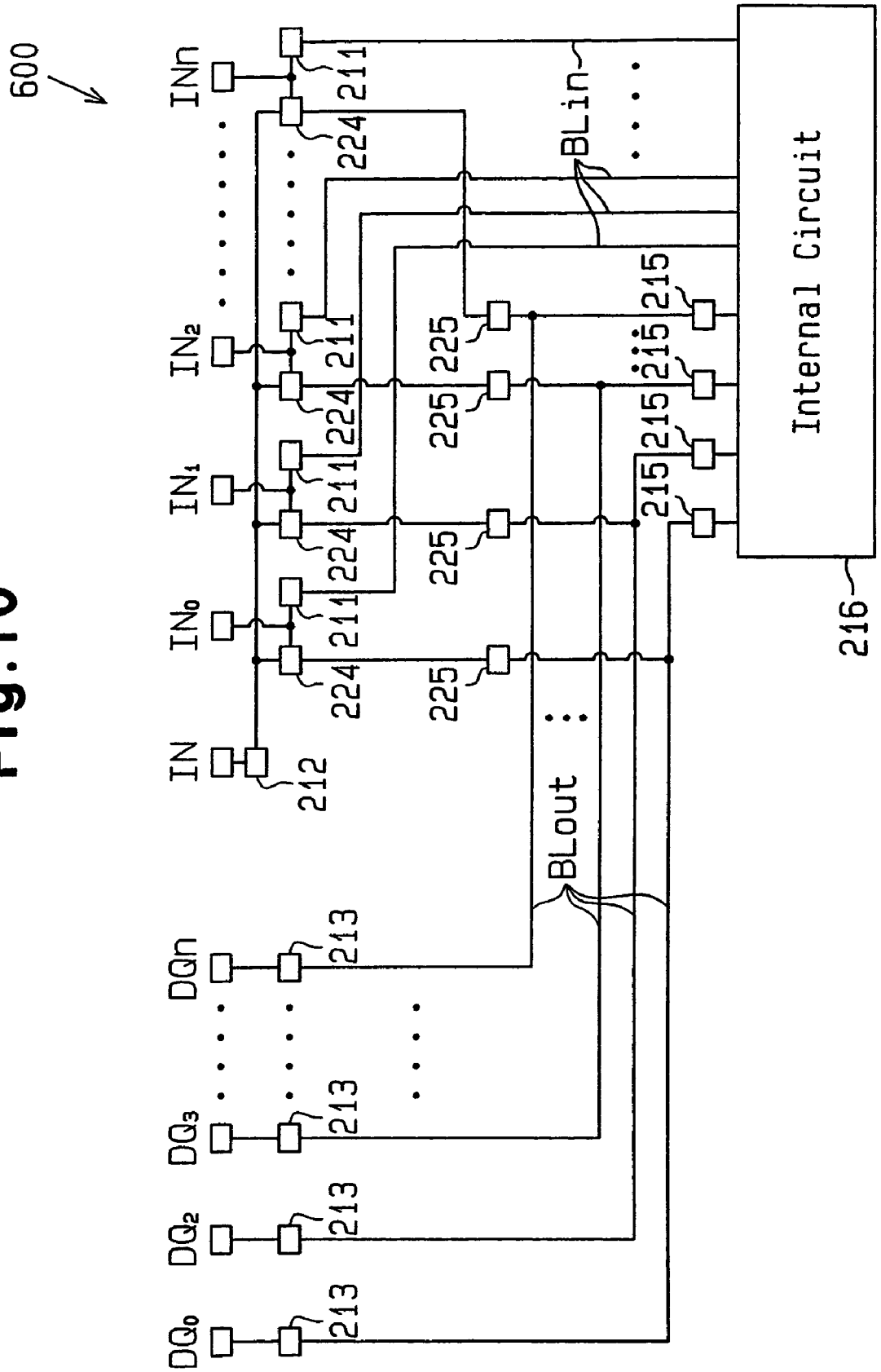
FIG. 10 is a schematic diagram of a SDRAM according to a fifth embodiment of the present invention.

FIG. 10 is a schematic circuit diagram of a SDRAM 600 according to a fifth embodiment. The SDRAM 600 has separate input logical circuits 224 and bus drive circuits 225. The input logical circuits 224 are laid out adjacent to the input pads IN0–INn, and the bus drive circuits 225 are laid out adjacent to the internal bus lines BLout.

This layout prevents an increase of the input capacity at the input terminal of the SDRAM 600, and an increase of the capacity due to the wiring of the internal bus lines BLout. As a result, the access time is not effected by the addition of the test circuits 14, and the power consumption is not increased.

[Sixth Embodiment]

Figure 11:
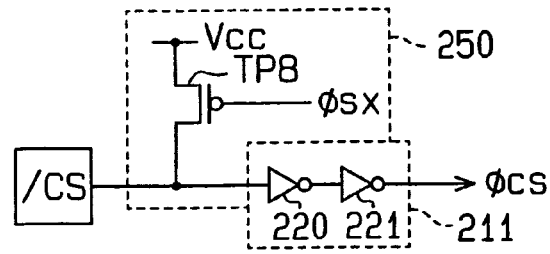
FIG. 11 is a circuit diagram of a clamp circuit of a SDRAM according to a sixth embodiment of the present invention.

In a sixth embodiment, the clamp circuits 245, 246 in FIG. 9 are replaced by a clamp circuit 250 shown in FIG. 11. The clamp circuit 250 does not operate in the normal operation mode. In the sixth embodiment, the SDRAM enters the test mode in accordance with a low chip select signal φcs. Therefore, the clamp circuit 250 clamps the input pad/cs high of the chip select signal φcs.

Figure 12:
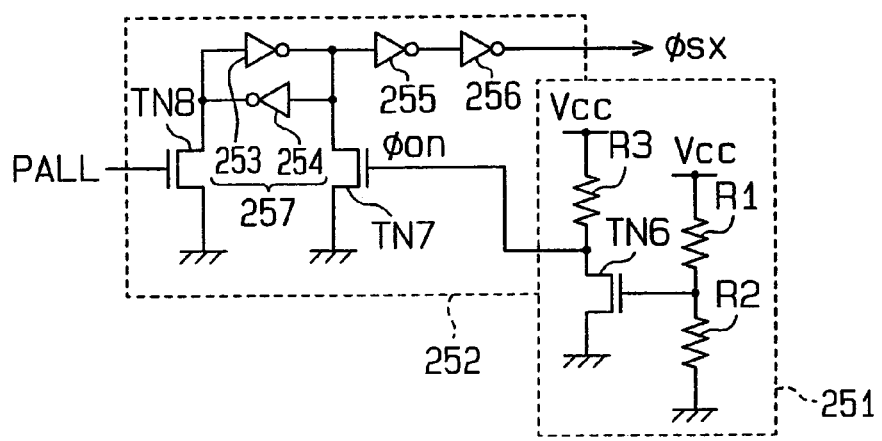
FIG. 12 is a circuit diagram of a start circuit and a determination circuit.

As shown in FIG. 11, the clamp circuit 250 preferably includes a PMOS transistor TP8 connected between the high potential power supply Vcc and the node between the input pad/cs and the input buffer 211. The gate of the PMOS transistor TP8 is supplied with a determination signal φsx, and the determination signal φsx controls the clamp circuit 250. As shown in FIG. 12, the determination signal φsx is generated by a start circuit 251 and a determination circuit 252.

The start circuit 251 includes an NMOS transistor TN6 and three resistors R1–R3. The resistor R1 and R2 are connected in series between the high potential power supply Vcc and the ground, which forms a potential divider. A divided voltage by the potential divider is supplied to the gate of the NMOS transistor TN6. The drain of the NMOS transistor TN6 is connected to the high potential power supply Vcc through the resistor R3, and the source of the NMOS transistor TN6 is grounded.

Figure 13:
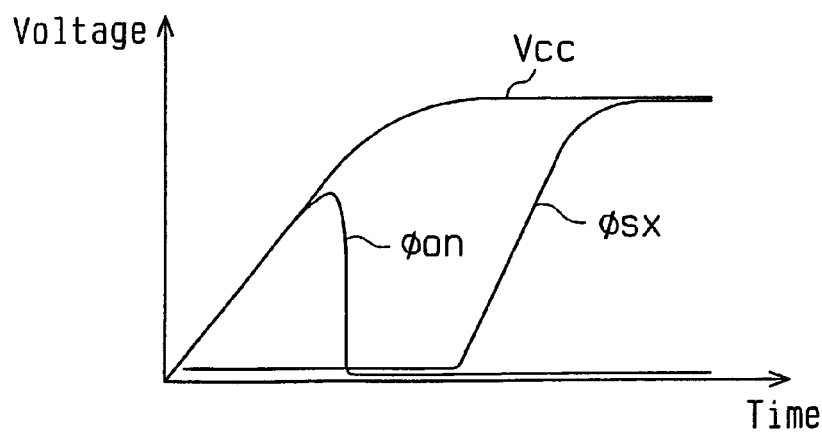
FIG. 13 is a wave-form chart of a determination signal of the determination circuit in FIG. 12.

As shown in FIG. 13, when the high potential power supply Vcc is supplied to the SDRAM 600 from the external device, the power supply voltage rises to a reference voltage. The divided voltage of the potential divider rises as the power supply voltage rises. When the power supply voltage reaches about half of the reference voltage, the NMOS transistor TN6 is turned ON, and the drain potential of the NMOS transistor TN6 falls from H level to L level. This falling drain potential of the NMOS transistor TN6 is supplied to the determination circuit 252 as a power-on signal φon. That is, the start circuit 251 supplies the determination circuit 252 with the power-on signal φon that falls from H level to L level after a specific time since the high potential power supply Vcc is turned on.

The determination circuit 252 includes two NMOS transistors TN7, TN8 and four inverters 253–256. Both of the sources of the NMOS transistors TN7, TN8 are grounded. Between the drain of the NMOS transistor TN7 and the drain of the NMOS transistor TN8, a latch circuit 257 is connected that is formed of the two inverters 253, 254. The gate of the NMOS transistor TN7 is supplied with the power-on signal φon, and the gate of the NMOS transistor TN8 is supplied with a pre-charge signal PALL. The pre-charge signal PALL is generated on the basis of a specific command signal (pre-charge command signal) from the external device. The pre-charge command is output by the external device at an earlier time, when the SDRAM is shifted into the normal operation. The drain potential of the NMOS transistor TN7 is supplied through the two inverters 255, 256 to the gate of the PMOS transistor TP8 as the determination signal φsx.

As shown in FIG. 13, after the power is turned ON, the NMOS transistor TN7 is turned on by the high power-on signal φon, and the drain of the NMOS transistor TN7 goes L level and the drain of the NMOS transistor TN8 goes H level. That is, the latch circuit 257 is initialized, and the low determination signal φsx is output from the determination circuit 252. As the power-on signal φon falls to L level after a specific time, the NMOS transistor TN7 is turned OFF, but the low determination signal φsx is continuously output, since the drain of the NMOS transistor TN7 is maintained at the L level by the latch circuit 257. Thereafter, as it is supplied with the pre-charge signal PALL having the H level, the NMOS transistor TN8 is turned ON, and the potential level maintained by the latch circuit 257 is inverted. Thereby, the determination signal φsx output from the determination circuit 252 turns from the L level to the H level. The PMOS transistor TP8 of the clamp circuit 250 is turned off by the high determination signal φsx, and the clamp circuit 250 is turned OFF in the normal operation mode. That is, the clamp circuit 250 is activated in the test mode and deactivated in the normal operation mode. In other words, in the test mode, the latch circuit 250 clamps the input pad/cs to H level, and in the normal operation mode, the latch circuit 250 is inoperative so as not to generate the leakage current.

The signal supplied to the gate of the NMOS transistor TN8 of the determination circuit 252 is not limited to the pre-charge signal PALL, but it may be a refresh signal or a mode register setting signal. The refresh signal is generated by the refresh command for the refresh operation, and the mode register setting signal is generated by the mode register setting command for the mode set operation. The commands are output from the external device, when the mode shifts into the normal operation mode.

The input pad to which the clamp circuit 250 is connected is not limited to the input pad/cs, but it may be an input pad/CAS or input pad/CKE. The input pad/CAS is supplied with a column address strobe signal CAS, and the input pad/CKE is supplied with a clock enable signal CKE.

The advantages of the sixth embodiment are as follows.

(1) In the test mode, if the input pad/cs is open, the input pad/cs is clamped to the H level by the clamp circuit 250. Therefore, plural SDRAMs are prevented from outputting signals simultaneously to the bus wiring on the board. In other words, bus line fights on the board are prevented. In case the clamp circuit 250 is not provided, the following disadvantages arise. That is, if a contact failure is created between the wiring on the board and an external terminal S of a SDRAM to make the input pad/cs open, the input pad/cs will become floating. At this moment, even if a conductive test is not performed, there can be a SDRAM that receives the low signal by error from the external device to enter the test mode. In this state, when the external device carries out the conductive test to another SDRAM, the signal is output to the bus line from the SDRAM that enters the test mode by error and another SDRAM, creating a bus fight.

(2) In the normal operation mode, the clamp circuit 250 is inoperative, and the power consumption due to the leakage current is avoided.

[Seventh Embodiment]

Figure 14:
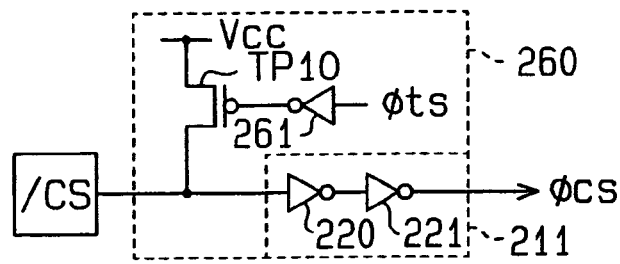
FIG. 14 is a circuit diagram of a clamp circuit of a SDRAM according to a seventh embodiment of the present invention.

In a seventh embodiment, the clamp circuit 246 in FIG. 9 is replaced by a clamp circuit 260 shown in FIG. 14. In the seventh embodiment, in the test mode, the SDRAM activates the output buffer 213 by the output activation signal φOE in response to the low chip select signal φcs. The SDRAM supplies the output signal to the bus lines on the board from the output pads DQ0–DQn. In the seventh embodiment, even if it enters the test mode in error, the SDRAM deactivates the output buffer 213 to inhibit outputting of signals by the chip signal φcs at the H level.

As shown in FIG. 14, the clamp circuit 260 includes a PMOS transistor TP10 connected between the high potential power supply Vcc and the node between the input pad/cs and the input buffer 211, and an inverter 261. The gate of the PMOS transistor TP10 is supplied with the test activation signal φts inverted by the inverter 261.

If the input pad/cs is not connected to the wiring on the board, which is in the open state, and the low chip select signal φcs is supplied by error to the internal circuit 216 through the input pad/cs, the SDRAM will enter the test mode. Then, the test activation signal φts is turned into H level to activate the clamp circuit 260. Namely, the input pad/cs is clamped to the high potential power supply Vcc. Next, as the low chip select signal φcs is supplied to the internal circuit 216, the internal circuit 216 deactivates the output buffer 213, and the SDRAM is inhibited from the outputting of signals. Therefore, bus fights are prevented on the board mounting plural SDRAMs.

[Eighth Embodiment]

Figure 15:
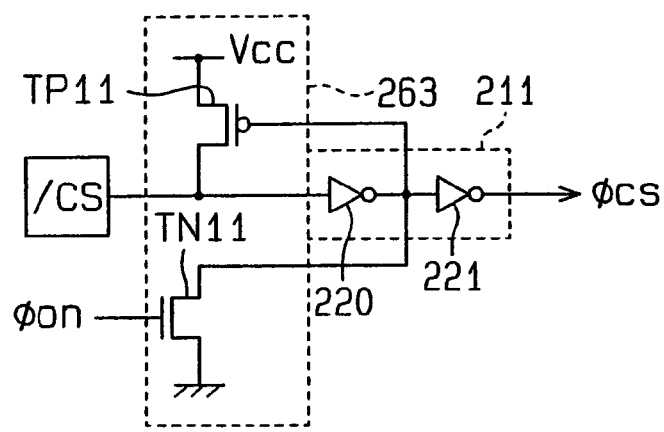
FIG. 15 is a circuit diagram of a clamp circuit of a SDRAM according to an eighth embodiment of the present invention.

In an eighth embodiment, the clamp circuit 246 in FIG. 9 is replaced by a clamp circuit 263 shown in FIG. 15. The clamp circuit 263 includes a PMOS transistor TP11 connected between the high potential power supply Vcc and the node between the input pad/cs and the input buffer 211, and an NMOS transistor TN11 connected between the node between the inverters 220, 221 and the ground. The gate of the PMOS transistor TP11 is connected to the node between the inverters 220, 221. The gate of the NMOS transistor TN11 is supplied with the power-on signal φon. The PMOS transistor TP11 and the inverter 220 are configured as a latch circuit.

When the input pad/cs is in the open state, after the power is turned on, the power-on signal φon turns the NMOS transistor TN11 on, and lowers the node potential between the inverters 220, 221 to the L level. Then, the PMOS transistor TP11 is turned ON, and the potential of the input pad/cs is clamped to the high potential power supply Vcc level. The potential of the input pad/cs is clamped to a potential level (Vcc–Vthp) such that the high potential power supply Vcc is lowered by the threshold voltage of the PMOS transistor TP11. If the clamp potential is higher than Vcc–Vthp, a leakage current will not be provided through the PMOS transistor TP11.

The input buffer 211 outputs the high chip select signal φcs, then the power-on signal on goes low, and the NMOS transistor TN11 is turned OFF. At this moment, the node between the inverters 220, 221 maintains the potential at the L level, and the input buffer 211 continues to output the high chip select signal φcs.

If the input pad/cs is connected to the wiring on the board, the potential of the input pad/cs is turned to L or H level. Here, if the potential of the input pad/cs is turned to H level, the node between the inverters 220, 221 will become L level to turn the PMOS transistor TP11 ON. However, since the potential of the input pad/cs is H level, a leakage current is not provided from the high potential power supply Vcc, through the PMOS transistor TP11. When the potential of the input pad/cs is turned to L level, the node between the inverters 220, 221 becomes H level to turn the PMOS transistor TP11 OFF. Therefore, a leakage current is not provided through the PMOS transistor TP11.

The advantages of the eighth embodiment are as follows.

(1) In the test mode, if the input pad/cs is open, the chip select signal φcs is maintained at the H level. Therefore, plural SDRAMs mounted on the board are prevented from executing the conductive test simultaneously. As a result, the bus line fights on the board are prevented.

(2) As the potential of the input pad/cs is turned to L level in accordance with the input signal from the external device, the PMOS transistor TP11 of the clamp circuit 263 is turned OFF, and a leakage current is not provided therethrough. On the other hand, as the potential of the input pad/cs is turned to H level, the PMOS transistor TP11 of the clamp circuit 263 is turned ON. However, since the input pad/cs is at the H level, a leakage current is not provided through the PMOS transistor TP11 from the high potential power supply. Thus, the clamp circuit 263 of the eighth embodiment suppresses a leakage current.

[Ninth Embodiment]

Figure 16:
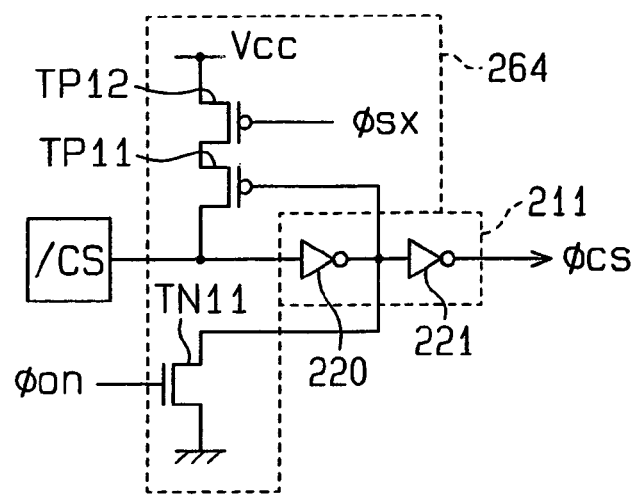
FIG. 16 is a circuit diagram of a clamp circuit of a SDRAM according to a ninth embodiment of the present invention.

In a ninth embodiment, the clamp circuit 263 in FIG. 15 is replaced by a clamp circuit 264 in FIG. 16. The clamp circuit 264 includes a PMOS transistor TP12 connected between the high potential power supply Vcc and the PMOS transistor TP11. The gate of the PMOS transistor TP12 is supplied with the determination signal φsx.

Figure 18:
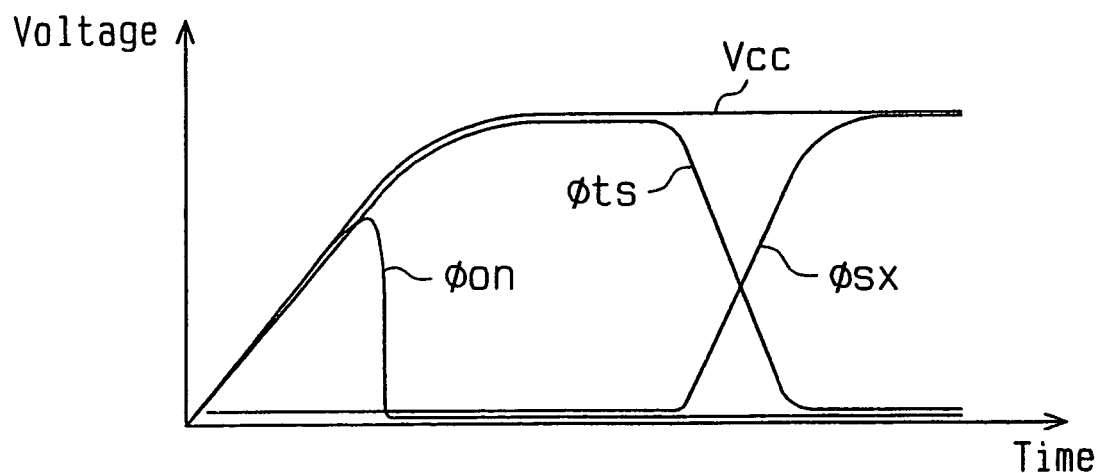
FIG. 18 is a wave-form chart of a test signal and a determination signal of the present invention.

As the high potential power supply Vcc is supplied to the SDRAM, as shown in FIG. 18, the low determination signal φsx turns the PMOS transistor TP12 on, and the high power-on signal φon turns the NMOS transistor TN11 and the PMOS transistor TP11 on. Thereby, the input pad/cs is clamped to the high potential power supply Vcc level.

After a predetermined time has passed since the high chip select signal φcs was supplied to the internal circuit 216 from the input buffer 211, the power-on signal φon falls to L level, and the NMOS transistor TN11 is turned OFF. Then, the node between the inverters 220, 221 maintains the potential at the L level, and the input buffer 211 continuously supplies the high chip select signal φcs to the internal circuit 216.

As the determination signal φsx is turned to H level, and the SDRAM is transferred to the normal operation mode, the PMOS transistor TP12 is turned OFF. That is, the clamp circuit 264 is deactivated in the normal operation mode. Therefore, even if a signal of 4.5 Volts is supplied from the external device, the input pad/cs is prevented from providing a leakage current to the high potential power supply Vcc. In other words, the ninth embodiment is suitable for a SDRAM capable of receiving a signal of, for example, 4.5 Volts from the external device, when the high potential power supply Vcc is set, for example, to 3.3 volts.

Figure 17:
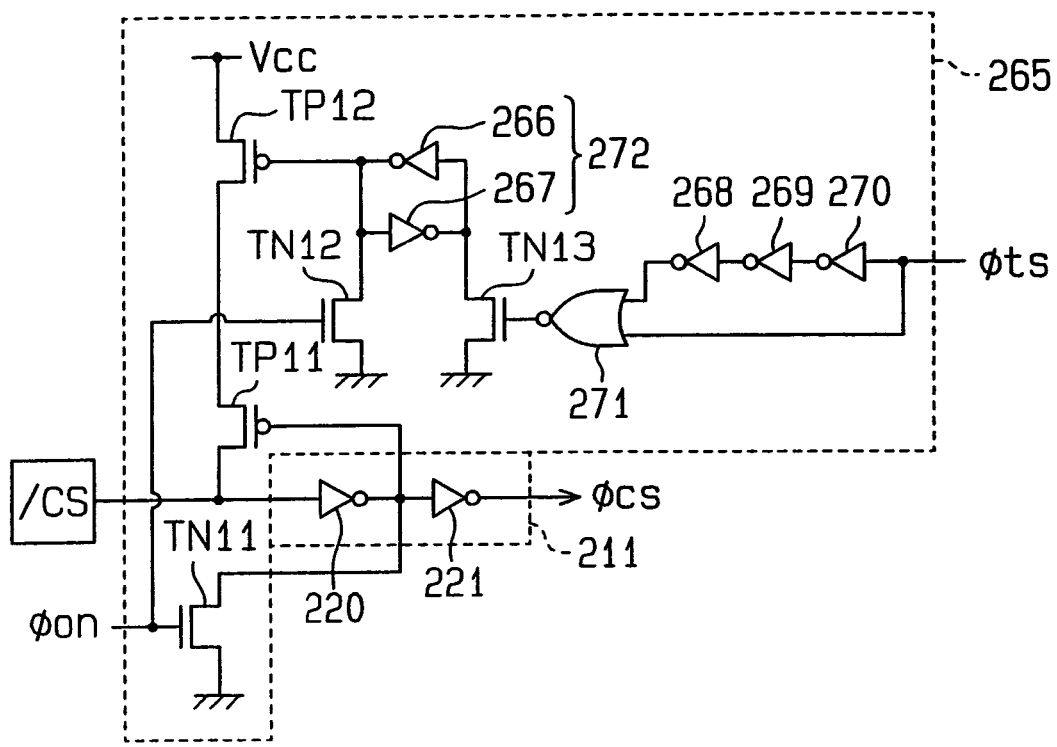
FIG. 17 is a circuit diagram of another clamp circuit in accordance with the present invention.

The clamp circuit 264 in FIG. 16 may be replaced by a clamp circuit 265 shown in FIG. 17. The clamp circuit 265 further includes two NMOS transistors TN12, TN13, five inverters 266–270, and a NOR circuit 271.

Both sources of NMOS transistors TN12, TN13 are grounded, and a latch circuit formed of the two inverters 266, 267 is connected between the drain of the NMOS transistor TN12 and the drain of the NMOS transistor TN13. The drain of the NMOS transistor TN12 is connected to the gate of the PMOS transistor TP12, and the gate of the NMOS transistor TN12 is connected to the gate of the NMOS transistor TN11. The gate of the NMOS transistor TN13 is connected to the output terminal of the NOR circuit 271. The first input terminal of the NOR circuit 271 is supplied with the test signal φts, and the second input terminal is supplied with the test signal φts inverted by the three inverters 268–270.

As the high potential power supply Vcc is supplied to the SDRAM, the high power-on signal φon turns the NMOS transistors TN11, TN12 on, and thereby turns the PMOS transistors TP11, TP12 on. Thus, the input pad/cs is clamped to the high potential power supply Vcc level. When the input pad/cs is in the open state, the high chip select signal φcs is supplied to the internal circuit 216 through the input buffer 211.

After a specific time, the power-on signal φon falls to L level, the NMOS transistors TN11, TN12 are turned OFF. Here, the gate of the PMOS transistor TP12 is held at the L level by the latch circuit 272, and the node between the inverters 220, 221 is maintained at the L level. Thus, the input buffer 211 continuously supplies the high chip select signal φcs to the internal circuit 216.

When the conductive test is completed (namely, when the test signal φts falls to L level), the NOR circuit 271 outputs a pulse signal having a pulse width determined by a delay time of the three inverters 268–270. The NMOS transistor TN13 is turned ON by the pulse signal, which inverts the potential level held by the latch circuit 272. That is, the drain potential of the NMOS transistor TN13 is turned to L level, and the drain potential of the NMOS transistor TN12 is turned to H level to turn the PMOS transistor TP12 OFF. As a result, after the conductive test is completed, the clamp circuit 265 is not activated, and even if a signal of 4.5 Volts is supplied from the external device, the input pad/cs does not provide a leakage current toward the high potential power supply Vcc.

The fourth through ninth embodiments may be modified as follows.

(a) In the sixth embodiment, the determination signal φsx supplied to the gate of the PMOS transistor TP8 of the clamp circuit 250 may be generated by a timer. The timer is preferably configured with an oscillator and a counter. The timer controls the PMOS transistor TP8 ON during the test mode, and controls it OFF during the normal operation mode. This will also prevents the leakage current.

(b) In the sixth through ninth embodiments, the input pad/cs is clamped by the high potential power supply Vcc. However, it is not limited to this. When a high signal is supplied to the input pad/cs on entering the test mode, the input pad/cs may be clamped to the ground level. This will prevent an erroneous entrance to the test mode, which is preferable in practical use. Consequently, an NMOS transistor whose drain is connected between the input pad/cs and the input buffer 211 and whose source is grounded is used. In this case, the input pad/cs is clamped to a potential level (Vss–Vthn) that is increased by the threshold voltage of the NMOS transistor against the ground level. Further, if the potential of the input signal is more than Vss–Vthn, a leakage current will not be provided through the NMOS transistor.

Figure 2:
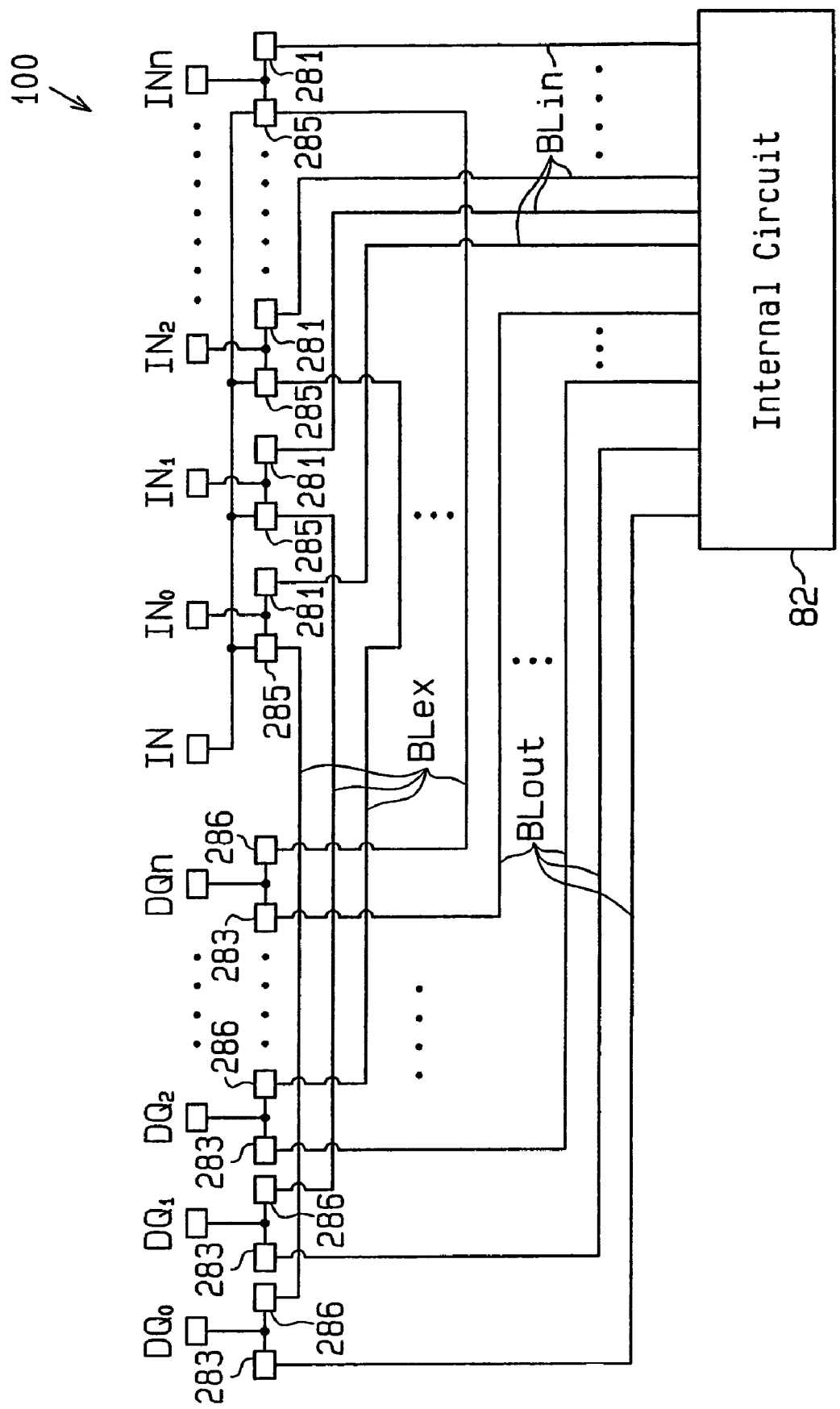
FIG. 2 is a schematic diagram of a conventional semiconductor device.

(c) The clamp circuits 250, 260, 263–265 in FIG. 11, FIG. 14–FIG. 17 may be applied to the conventional semiconductor device 100 in FIG. 2. Also in this case, the input pad/cs is clamped in the test mode, and a leakage current is prevented from flowing in the normal operation mode.

Figure 19:
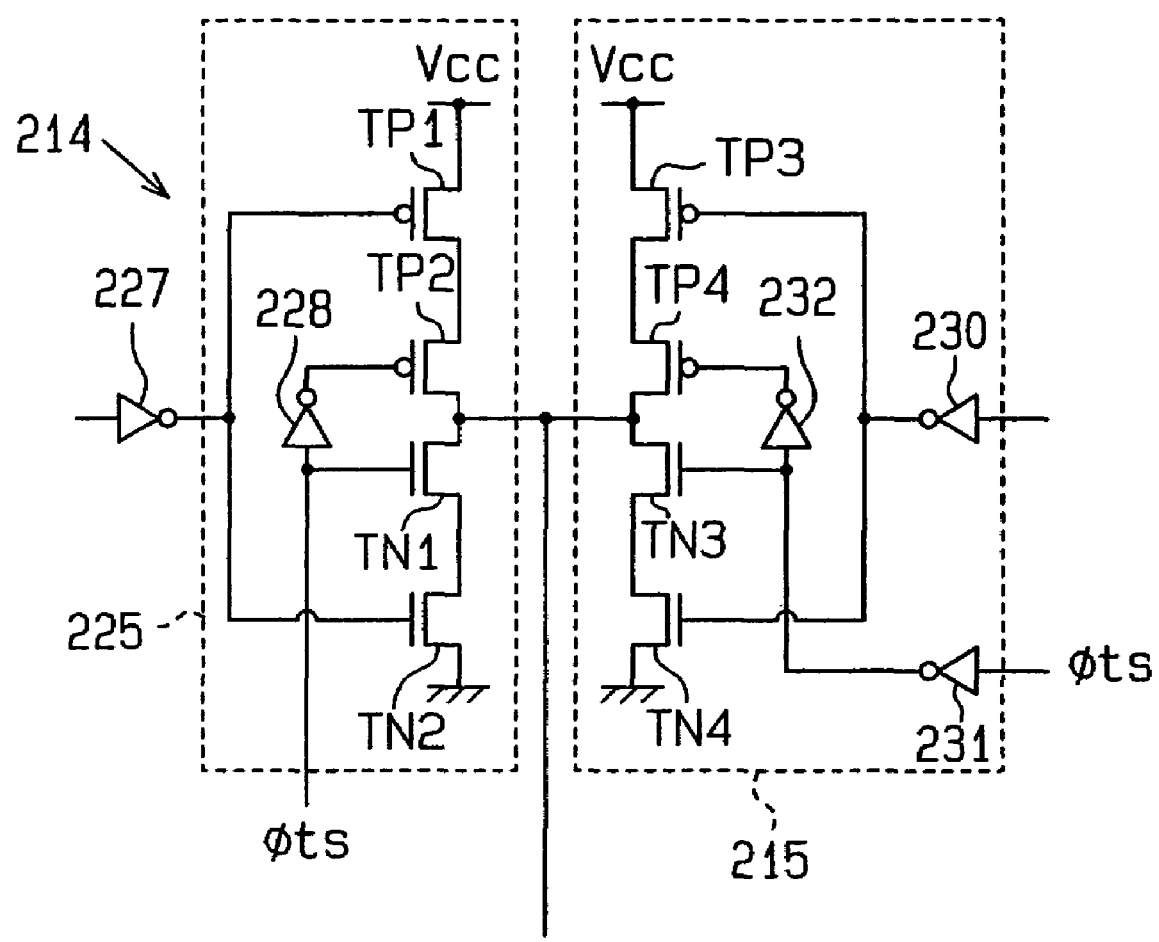
FIG. 19 is a circuit diagram of a bus drive circuit in accordance with the present invention.

(d) The bus drive circuits 215, 225 may be modified as shown in FIG. 19. In the bus drive circuits 215, 225, the test signal φts as the activation signal is supplied to the PMOS transistors-TP2, TP4 and the NMOS transistors TN1, TN3 which are located near the bus wiring. Therefore, while the bus drive circuits 215, 225 are deactivated, the input capacitance of the MOS transistors of the bus drive circuits 215, 225 is prevented from being added to the capacitance of the internal bus BLout.

(e) The power-on signal φon may be turned off during the specific time, instead of being turned on during the specific time as shown in FIG. 13 or FIG. 18. In this case, a clamp circuit is needed to operate by the power-on signal that is turned off during the specific time.

(f) The invention may be applied to a semiconductor integrated circuit device that does not contain a RAM or a memory other than a SDRAM.

(g) In order to transmit the test signal, the internal bus line BLin for input may be shared instead of the internal bus line BLout for output. In this case, the internal bus line BLin is physically laid out between the input buffer 211 and the test circuit 214.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:
1. A semiconductor device comprising:
input terminals;
output terminals
an internal circuit
first bus lines that connect the input terminals and the internal circuit, respectively;

second bus lines that connect the output terminals and the internal circuit, respectively;

test circuits connected between said input terminals and said output terminals via test signal transmission paths, wherein at least a part of said first bus lines or said second bus lines is shared by said test signal transmission paths;

a first bus drive circuit connected between the test circuits and the output terminals through the test signal transmission paths and activated in a test mode; and a second bus drive circuit connected between the internal circuit and the output terminals through the second bus lines and activated in normal mode.

2. The semiconductor device of claim 1, wherein each of the test circuit includes:

an input logical circuit connected to the input terminals.

3. The semiconductor device of claim 2, wherein the input logic circuit is disposed proximate to the input terminals, and the second bus drive circuit is disposed proximate to the second bus line.

4. The semiconductor device of claim 2, wherein the second bus drive circuit includes:

two PMOS transistors connected in series between a high potential power supply and the second bus line; and two NMOS transistors connected in series between a low potential power supply and the second bus line, and wherein an activation signal of the second bus drive circuit is supplied to the gate of the PMOS transistor closing to the high potential power supply and the gate of the NMOS transistor closing to the low potential power supply.

5. The semiconductor device of claim 1, further comprising clamp circuits connected to the respective input terminals, that clamp the input terminals to a specific potential.

6. The semiconductor device of claim 5, wherein the clamp circuits clamp the input terminals to the specific potential in a test mode, and release the clamp in a normal operation mode.

7. The semiconductor device of claim 5, wherein the clamp circuits are controlled by an activation signal of the test circuit.

8. The semiconductor device of claim 5, wherein the clamp circuits include a MOS transistor, and the gate of the MOS transistor is supplied with an inverted signal of the potential level at the corresponding input terminal.

9. The semiconductor device of claim 5, wherein the clamp circuits are controlled by a power on signal and an activation signal of the test signal.

10. The semiconductor device of claim 5, wherein the clamp circuits are controlled by a power on signal and a normal mode signal.

11. The semiconductor device of claim 10, wherein the normal mode signal is generated on the basis of detecting an operation conducted when power is turned on.

12. The semiconductor device of claim 11, wherein the operation conducted when the power is turned on includes at least one of a pre charge operation, a mode setting operation, and a refresh operation.

13. The semiconductor device of claim 5, wherein each input terminal includes a terminal that receives a chip select signal.

14. The semiconductor device of claim 5, wherein each input terminal includes a terminal that receive a column address strobe signal.

15. The semiconductor device of claim 5, wherein each input terminal includes a terminal that receives a clock enable signal.

16. The semiconductor device of claim 5, wherein the clamp circuits clamp at least one input terminal to an inverted potential level of the specific potential level supplied to the one input terminal when entering the test mode.

17. The semiconductor device of claim 5, wherein the clamp circuit includes a latch circuit that holds the specific potential level when the power is turned on, and the clamp circuit clamps the input terminal to the specific potential level held by the latch circuit.

18. The semiconductor device according to claim 1, further comprising clamp circuits connected to the input terminals, that clamp the respective input terminals to a specific potential that is different from a potential of a test mode signal provided to the respective input terminals in a test mode, and release the clamp of the input terminals in a normal operation mode.

19. The semiconductor device of claim 1, further comprising output buffer circuits to receive output signals from said internal circuit in a first operation mode, receive test signals from said test circuits in a second operation mode, and output buffer output signals to said output terminals.

* * * * *